United States Patent
Pfirsch et al.

(10) Patent No.: US 9,917,181 B2
(45) Date of Patent: Mar. 13, 2018

(54) BIPOLAR TRANSISTOR WITH SUPERJUNCTION STRUCTURE

(71) Applicant: Infineon Technologies AG, Neubiberg (DE)

(72) Inventors: Frank Dieter Pfirsch, Munich (DE);
Franz-Josef Niedernostheide, Hagen am Teutoburger Wald (DE);
Hans-Joachim Schulze, Taufkirchen (DE); Stephan Voss, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/296,594

(22) Filed: Oct. 18, 2016

(65) Prior Publication Data
US 2017/0117394 A1   Apr. 27, 2017

(30) Foreign Application Priority Data
Oct. 27, 2015  (DE) .................. 10 2015 118 322

(51) Int. Cl.
| | |
|---|---|
| *H01L 29/00* | (2006.01) |
| *H01L 29/739* | (2006.01) |
| *H01L 29/15* | (2006.01) |
| *H01L 29/08* | (2006.01) |

(52) U.S. Cl.
CPC ........ *H01L 29/7395* (2013.01); *H01L 29/083* (2013.01); *H01L 29/157* (2013.01); *H01L 29/7397* (2013.01)

(58) Field of Classification Search
CPC . H01L 29/7395; H01L 29/083; H01L 29/157; H01L 29/7397
See application file for complete search history.

(56) References Cited

U.S. PATENT DOCUMENTS

| | | | |
|---|---|---|---|
| 6,103,578 A * | 8/2000 | Uenishi | H01L 21/26546 257/E21.146 |
| 6,936,892 B2 * | 8/2005 | Fujihira | H01L 29/0619 257/339 |
| 7,791,138 B2 | 9/2010 | Pfirsch et al. | |
| 9,029,944 B2 | 5/2015 | Willmeroth et al. | |
| 2005/0035371 A1 * | 2/2005 | Fujihira | H01L 29/0619 257/200 |
| 2010/0230715 A1 | 9/2010 | Mauder et al. | |
| 2010/0308399 A1 | 12/2010 | Saito et al. | |
| 2014/0231912 A1 | 8/2014 | Willmeroth et al. | |

FOREIGN PATENT DOCUMENTS

| | | |
|---|---|---|
| DE | 10 2007 052 202 B3 | 11/2008 |
| DE | 10 2014 101 847 A1 | 8/2014 |
| DE | 10 2014 101 951 A1 | 8/2014 |

* cited by examiner

*Primary Examiner* — Nikolay Yushin
(74) *Attorney, Agent, or Firm* — Volpe and Koenig, P.C.

(57) ABSTRACT

A superjunction bipolar transistor includes an active transistor cell area that includes active transistor cells electrically connected to a first load electrode at a front side of a semiconductor body. A superjunction area overlaps the active transistor cell area and includes a low-resistive region and a reservoir region outside of the low-resistive region. The low-resistive region includes a first superjunction structure with a first vertical extension with respect to a first surface of the semiconductor body. The reservoir region includes no superjunction structure or a second superjunction structure with a mean second vertical extension smaller than the first vertical extension.

25 Claims, 27 Drawing Sheets

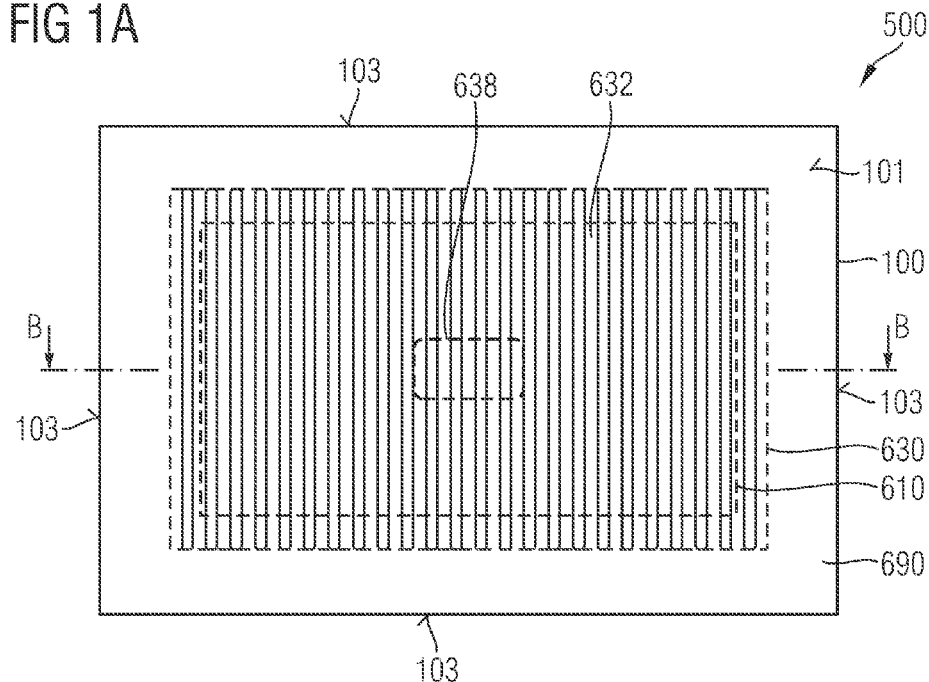
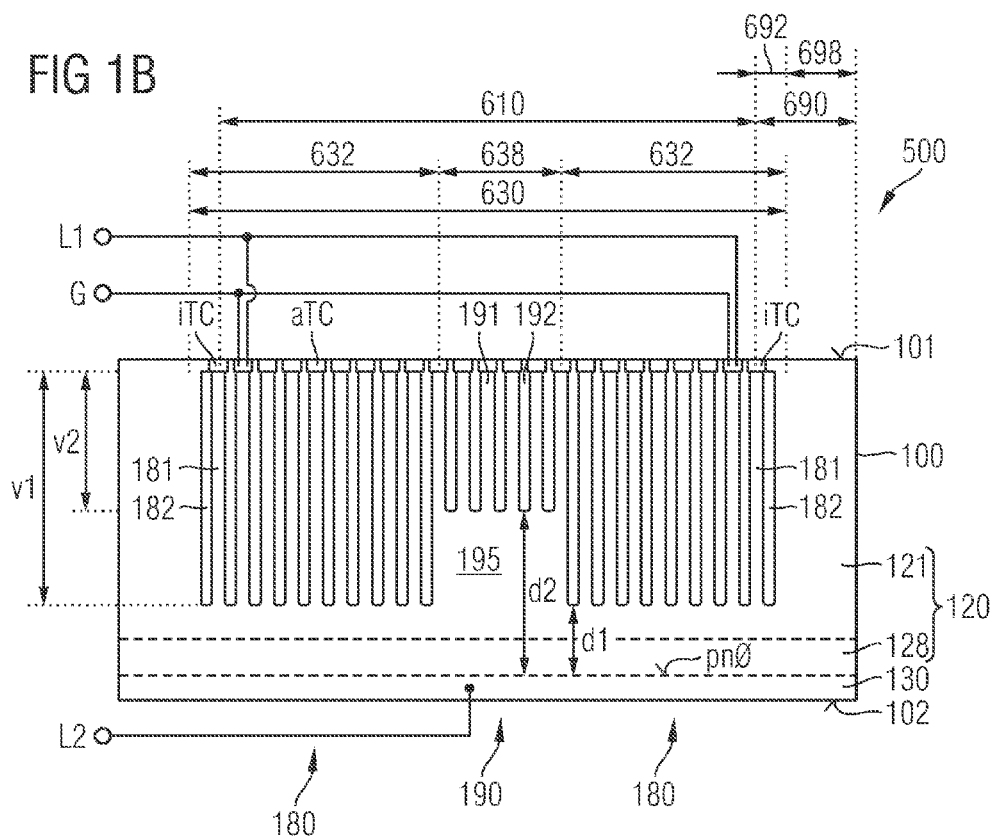

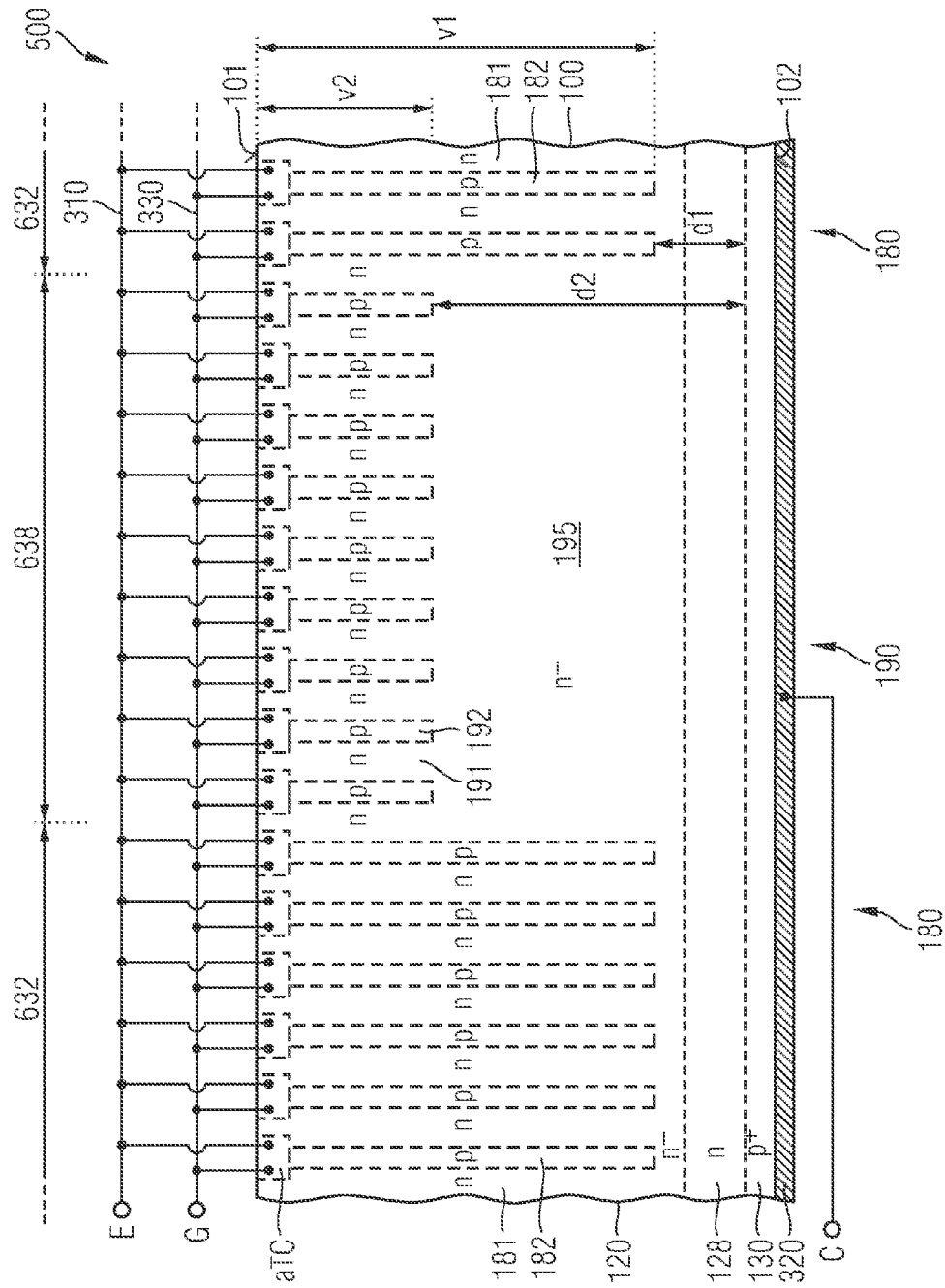

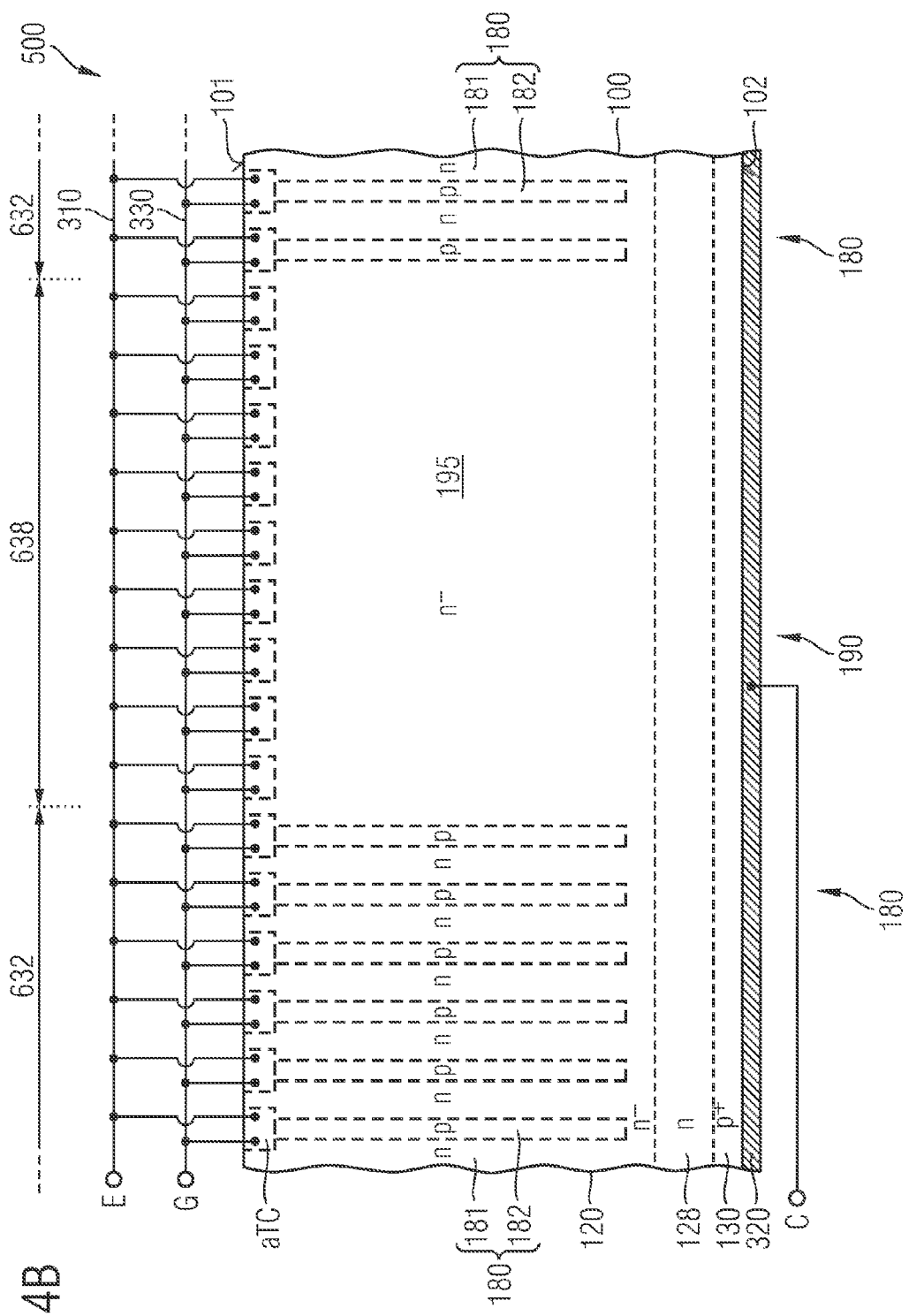

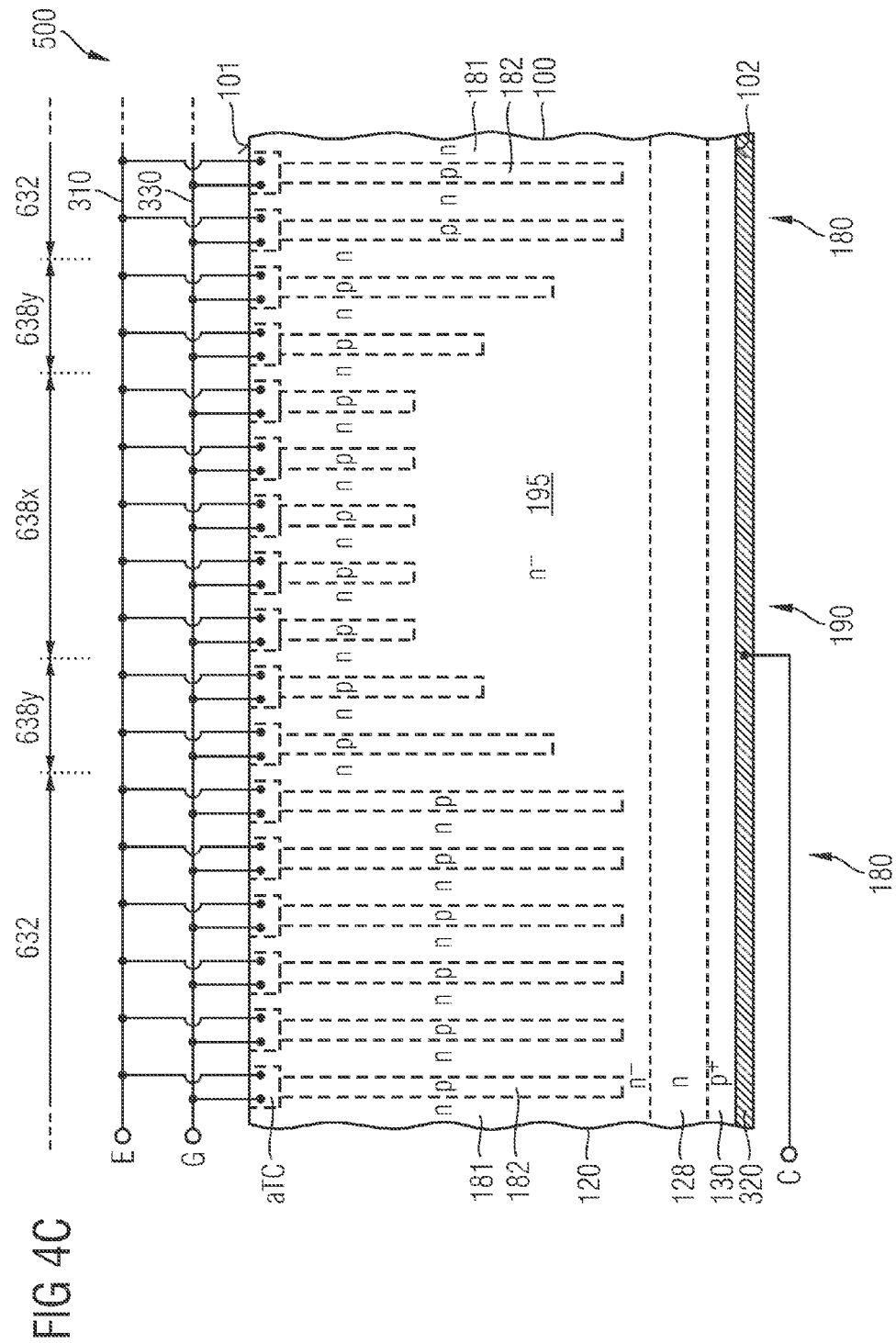

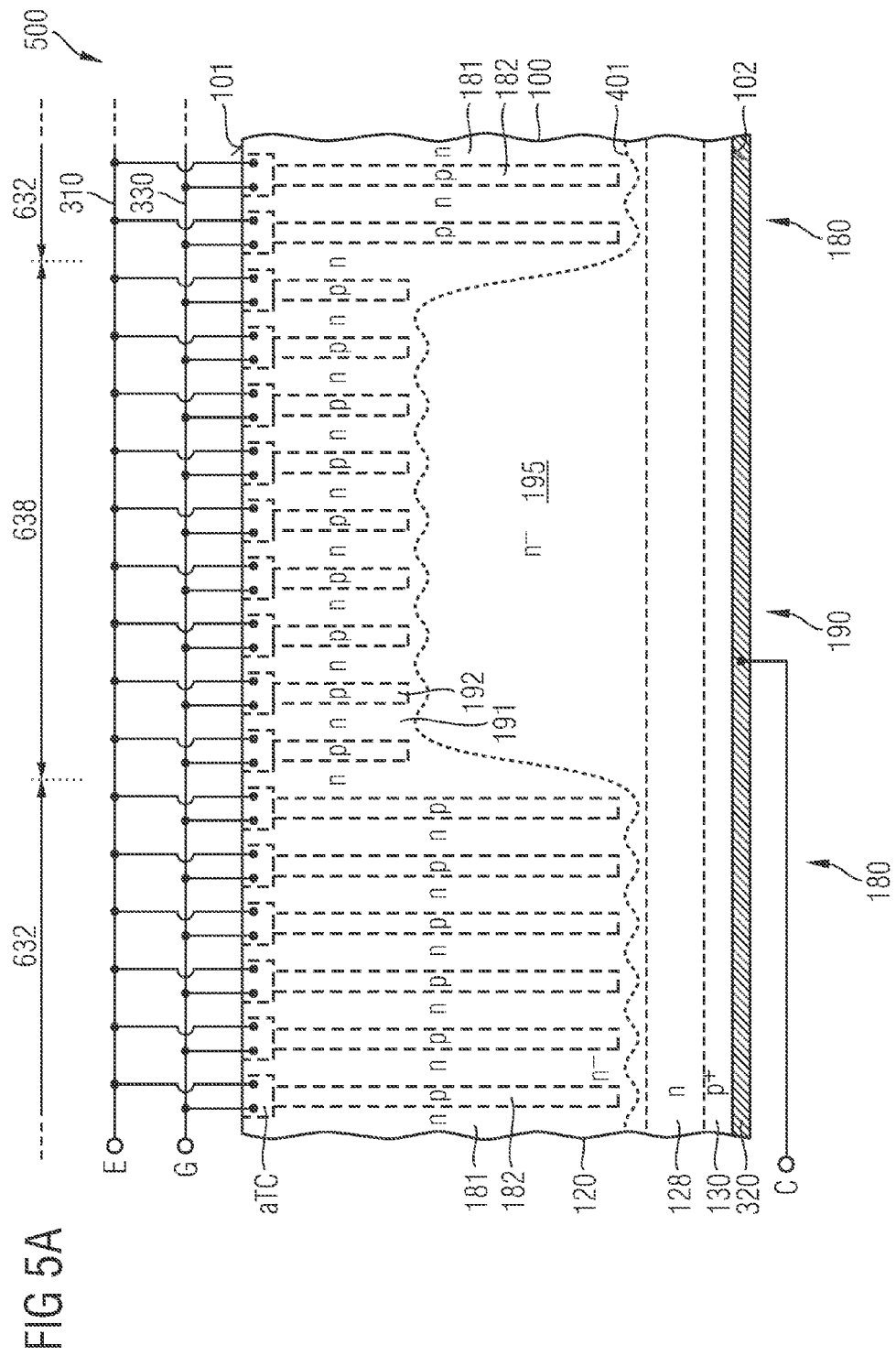

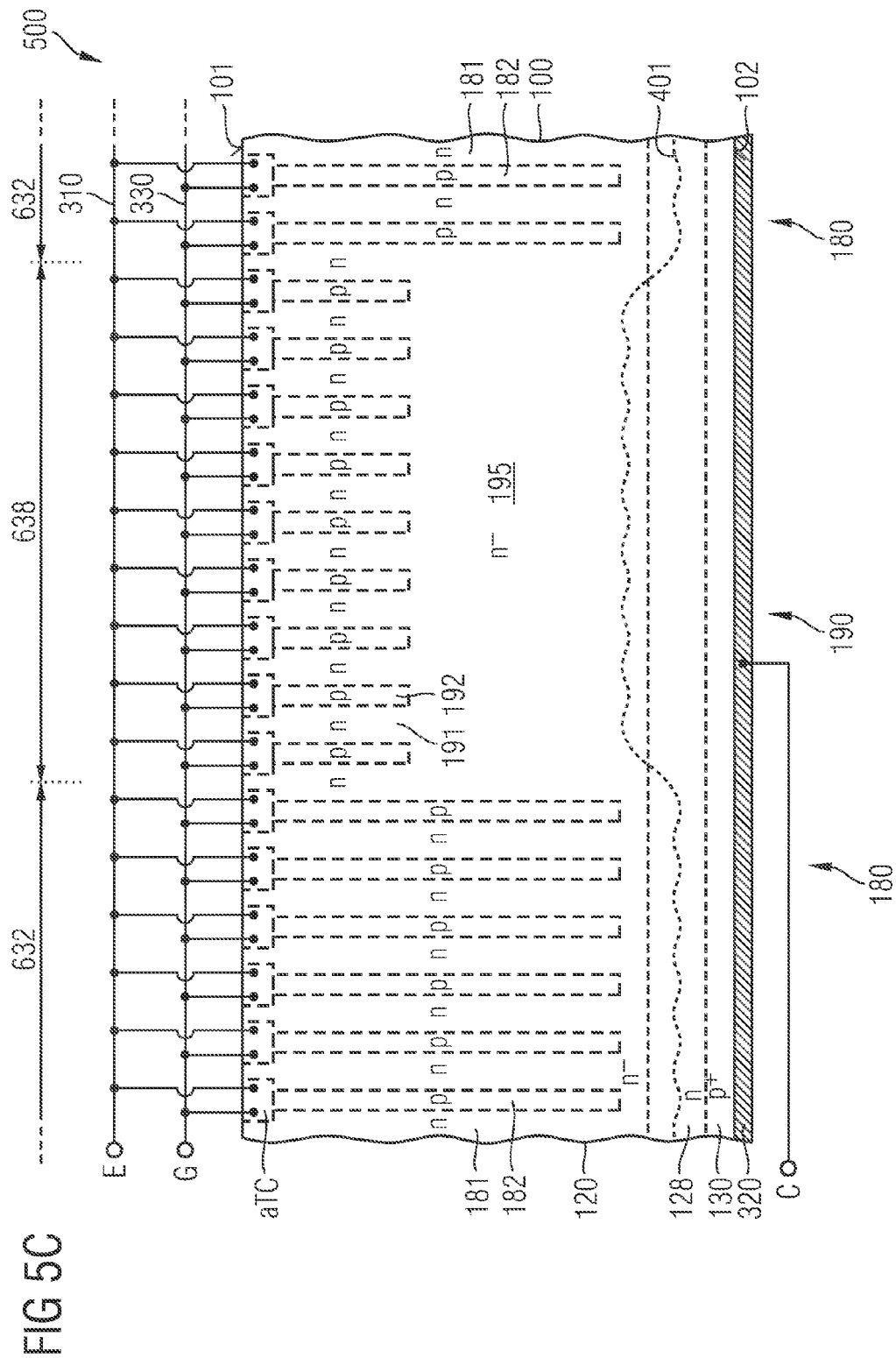

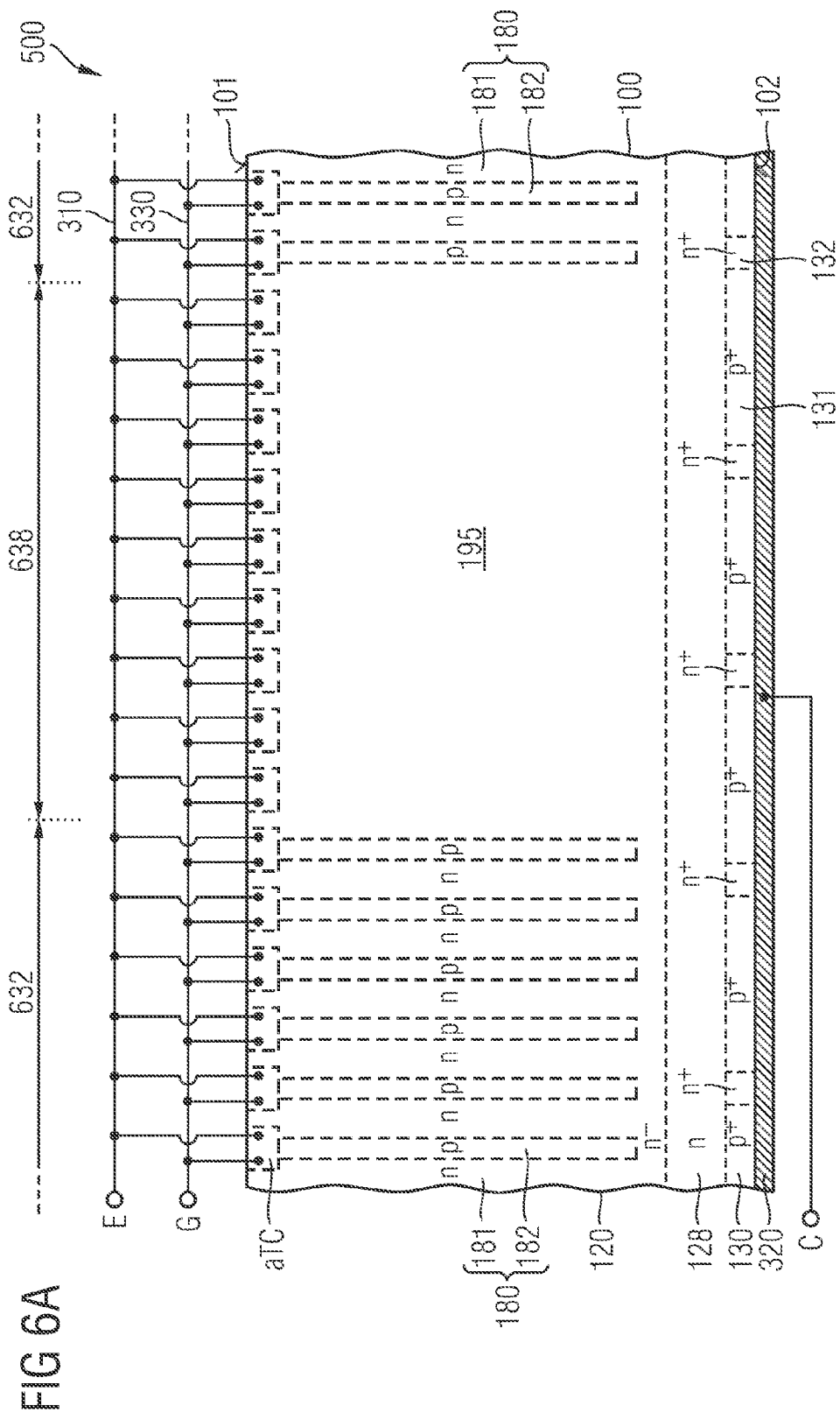

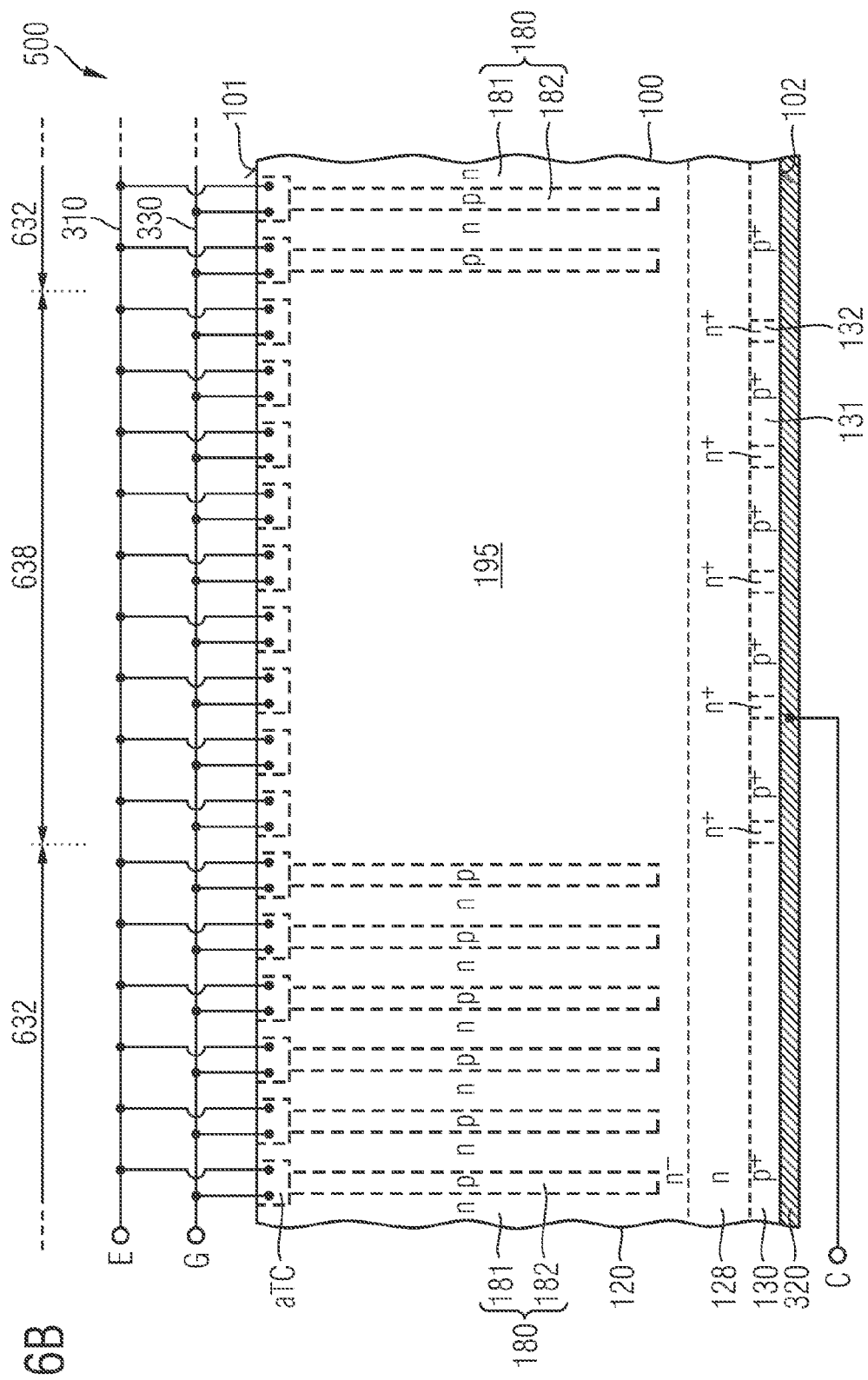

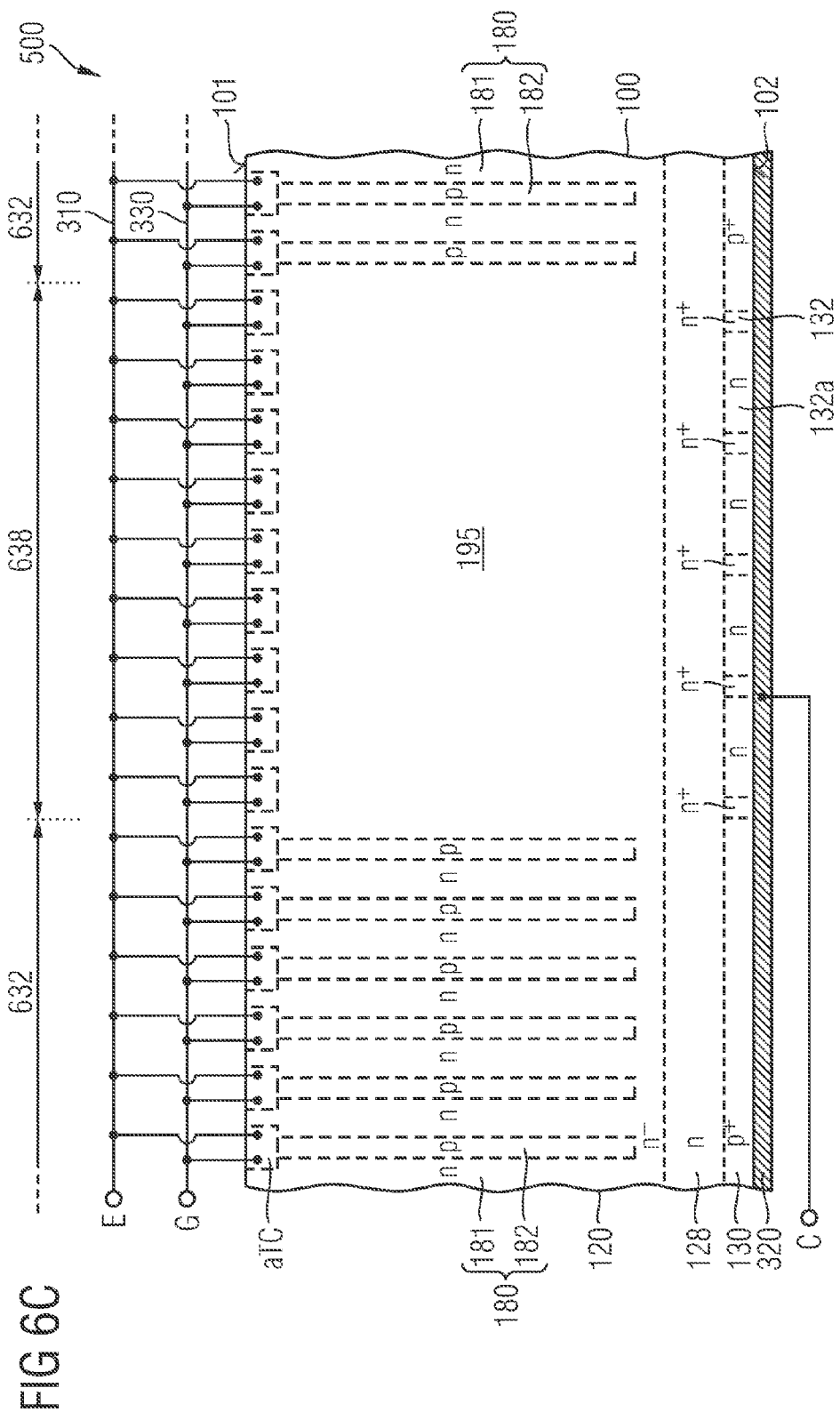

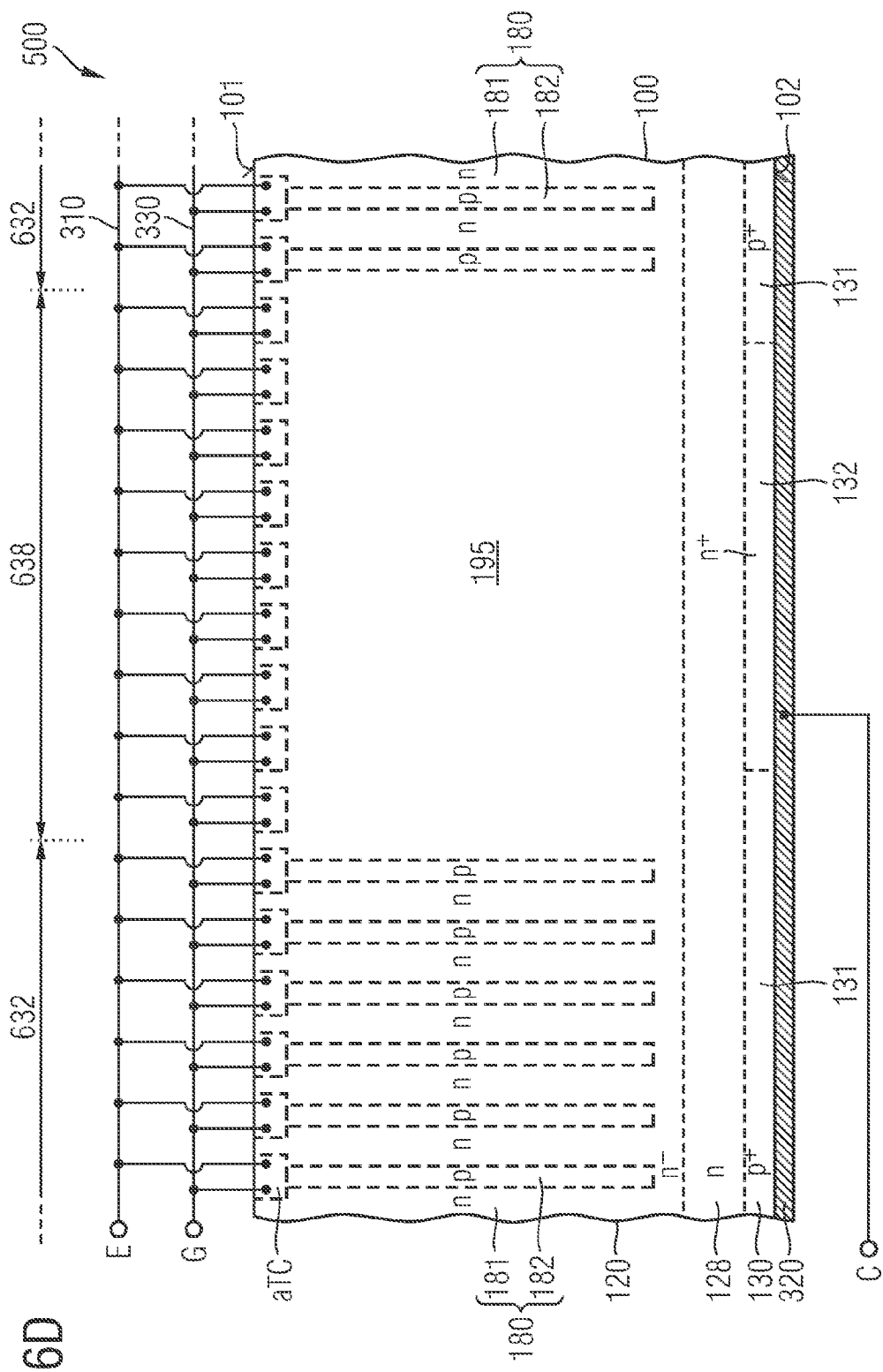

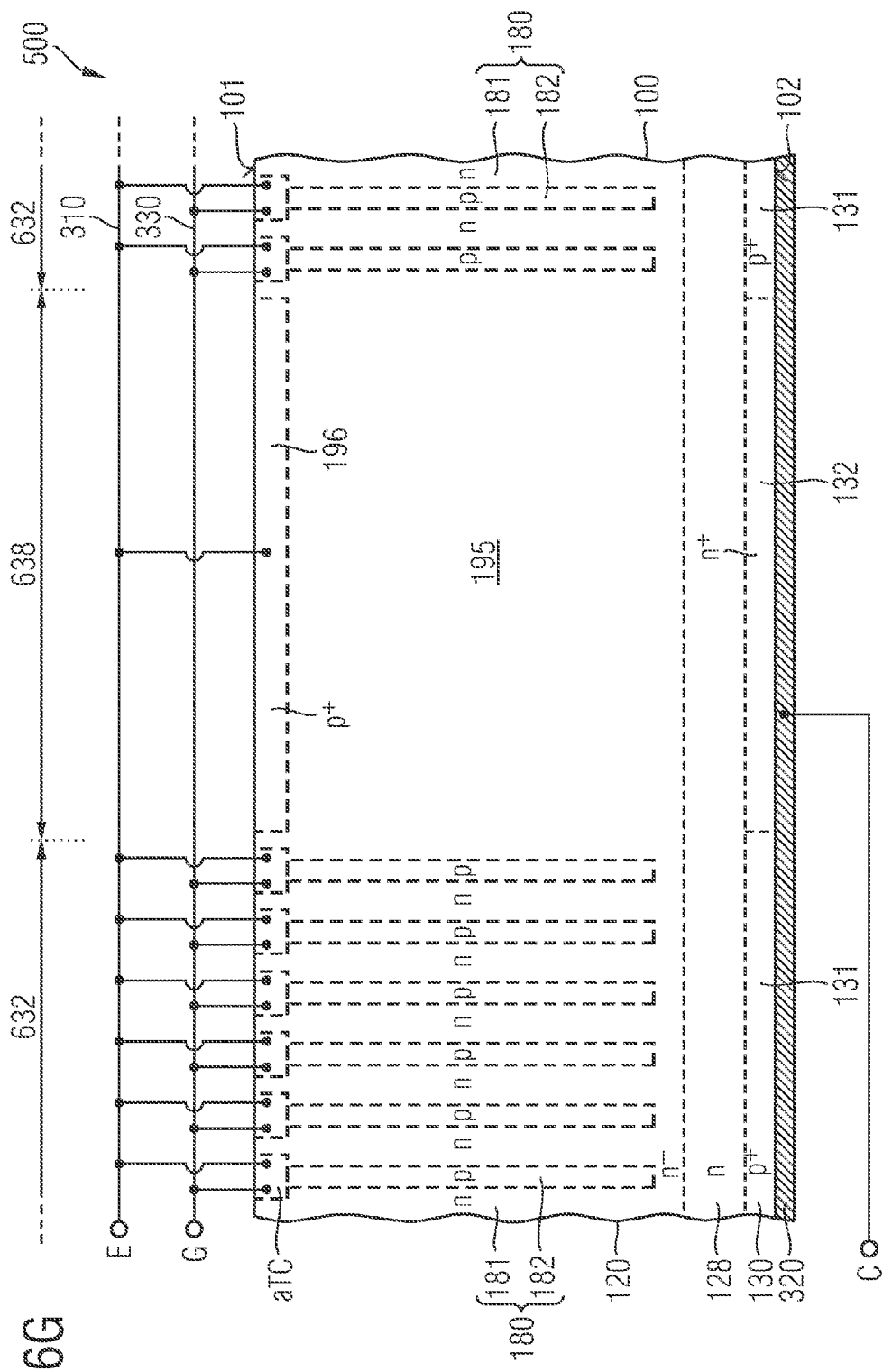

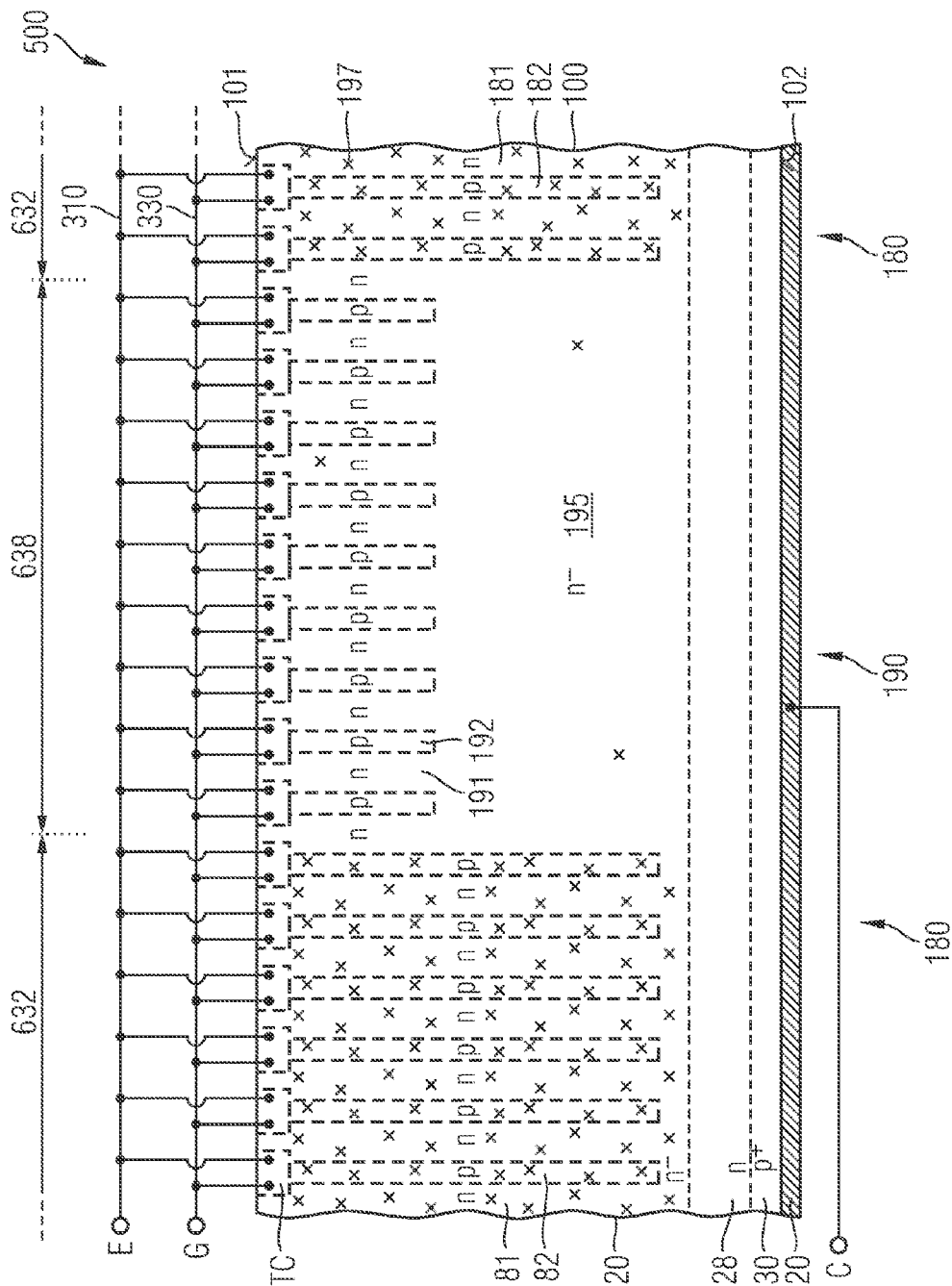

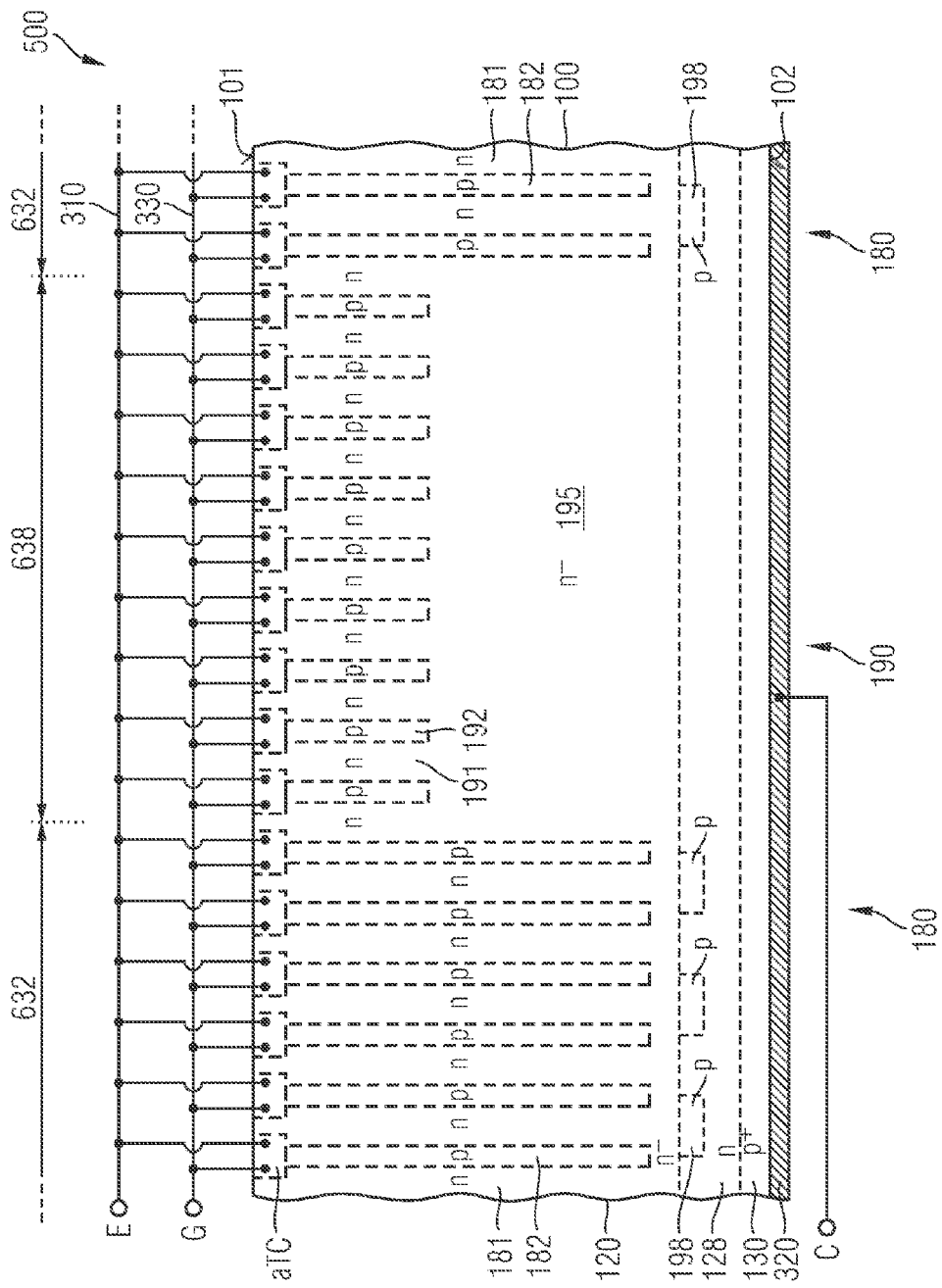

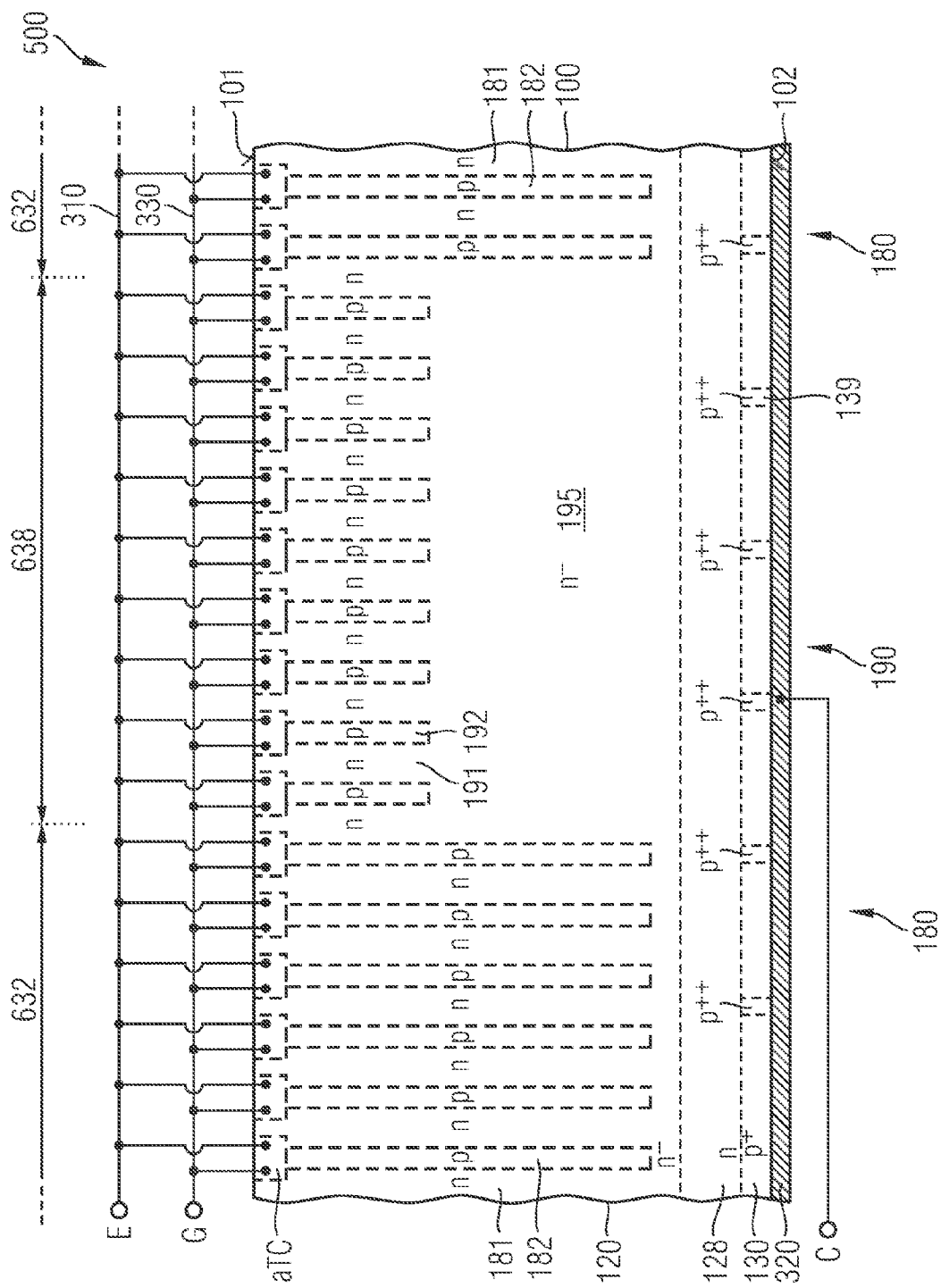

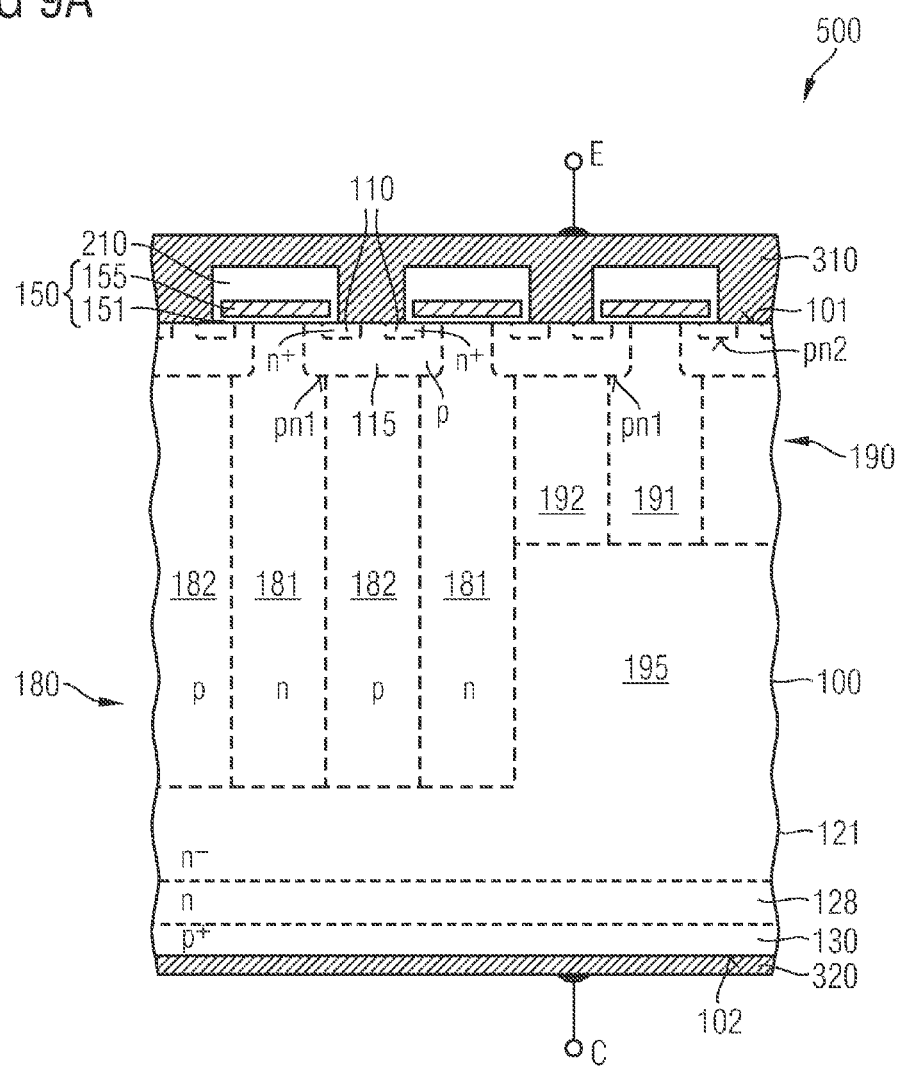

US 9,917,181 B2

BIPOLAR TRANSISTOR WITH SUPERJUNCTION STRUCTURE

FIELD

The present disclosure relates generally to bipolar transistors, and, more particularly, to superjunction bipolar transistors.

BACKGROUND

In insulated gate bipolar transistors (IGBTs), insulated gate field effect transistor (IGFET) cells control a base current of a bipolar junction transistor (BJT). Minority carriers injected from a collector region of the BJT into a drift region during forward conduction considerably reduce the on-state resistance of the low doped drift region. In an superjunction IGBT (SJ-IGBT) or superjunction bipolar transistor (SJ-BT), a superjunction structure including alternatingly arranged and more strongly doped p-type and n-type semiconductor areas replaces at least a portion of the drift region. Since the electric field builds up not only in a vertical direction but also in a horizontal direction parallel to main surfaces of the SJ-IGBT, the breakdown voltage of SJ-IGBTs to a lower degree dependents on the dopant concentration in the drift region assumed that the p-type semiconductor areas and n-type semiconductor areas compensate each other sufficiently well and are completely depleted before breakdown takes place. Unlike in superjunction IGFETs both types of semiconductor areas contribute to a current flow and affect the switching behavior.

It is desirable to improve the switching behavior of superjunction bipolar transistors such as SJ-IGBTs.

SUMMARY

According to an embodiment, a superjunction bipolar transistor includes an active transistor cell area that includes active transistor cells electrically connected to a first load electrode at a front side of a semiconductor body. A superjunction area overlaps the active transistor cell area, wherein the superjunction area includes a low-resistive region and a reservoir region outside of the low-resistive region. The low-resistive region includes a first superjunction structure with a first vertical extension with respect to a first surface of the semiconductor body. The reservoir region includes no superjunction structure or a second superjunction structure with a mean second vertical extension smaller than the first vertical extension.

According to a further embodiment a superjunction semiconductor device includes a first superjunction structure in a low-resistive region and no or a second superjunction structure in a reservoir region outside of the low-resistive region. In case the low-resistive region includes a second superjunction structure, a first vertical extension of the first superjunction structure with respect to a first surface of the semiconductor body is greater than a mean second vertical extension of the second superjunction structure. The first superjunction structure includes first areas and oppositely doped second areas alternating with the first areas along at least one horizontal direction parallel to the first surface. Active transistor cells include body zones forming first pn junctions with at least the first areas of the first superjunction structure and second pn junctions with source zones. A collector structure is electrically connected to a second load electrode, wherein at least portions of the collector structure have a conductivity type of the body zones.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 1A is a schematic plan view of a superjunction semiconductor device with a low-resistive region including a first superjunction structure and with a reservoir region according to one or more embodiments;

FIG. 1B is a schematic vertical cross-sectional view of the superjunction semiconductor device of FIG. 1A along line B-B according to one or more embodiments with the reservoir region including a second superjunction structure;

FIG. 4A is a schematic vertical cross-sectional view of a portion of a superjunction semiconductor device according to one or more embodiments with a second superjunction structure in the reservoir region;

FIG. 4B is a schematic vertical cross-sectional view of a portion of a superjunction semiconductor device according to one or more embodiments with no superjunction structure in the reservoir region;

FIG. 4C is a schematic vertical cross-sectional view of a portion of a superjunction semiconductor device according to one or more embodiments with a reservoir region including a transition region;

FIG. 5A is a schematic vertical cross-sectional view of the superjunction semiconductor device of FIG. 4A and showing a boundary of a depletion zone at a first point in time after switching off the superjunction semiconductor device, for illustrating effects of the embodiments;

FIG. 5C is a schematic vertical cross-sectional view of the superjunction semiconductor device of FIG. 4A and showing the boundary of the depletion zone at a third point in time after switching off the superjunction semiconductor device, for illustrating effects of the embodiments;

FIG. 6A is a schematic vertical cross-sectional view of a portion of a superjunction RC-IGBT (reverse conducting IGBT) according to one or more embodiments;

FIG. 6B is a schematic vertical cross-sectional view of a portion of a superjunction RC-IGBT with diode cathode zones of a diode portion exclusively formed in the reservoir region according to one or more embodiments;

FIG. 6C is a schematic vertical cross-sectional view of a portion of a superjunction RC-IGBT with IGBT zones of an IGBT portion exclusively formed outside of the reservoir region, according to one or more embodiments;

FIG. 6D is a schematic vertical cross-sectional view of a portion of a superjunction RC-IGBT with a homogenously doped diode cathode zone of a diode portion exclusively formed within the reservoir region according to one or more embodiments;

FIG. 6G is a schematic vertical cross-sectional view of a portion of a superjunction RC-IGBT with a homogenously doped diode cathode zone and a diode anode zone of a diode portion spanning across the complete reservoir region according to one or more embodiments;

FIG. 7 is a schematic vertical cross-sectional view of a portion of a superjunction semiconductor device with a reservoir zone with reduced density of recombination centers according to one or more embodiments;

FIG. 8A is a schematic vertical cross-sectional view of a portion of a superjunction semiconductor device according to one or more embodiments with counter-doped islands exclusively formed in the low-resistive region and close to a collector side;

FIG. 8B is a schematic vertical cross-sectional view of a portion of a superjunction semiconductor device according to one or more embodiments with enhanced backside emitter zones;

FIG. 9A is a schematic vertical cross-sectional view of a portion of a superjunction semiconductor device including transistor cells with planar gate structures according to one or more embodiments;

DETAILED DESCRIPTION

In the following detailed description, reference is made to the accompanying drawings, which form a part hereof and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language, which should not be construed as limiting the scope of the appending claims. The drawings are not scaled and are for illustrative purposes only. Corresponding elements are designated by the same reference sign in the different drawings, respectively, if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example resistors or elements that are controllable to temporarily provide a low-ohmic connection in a first state and a high-ohmic electric decoupling in a second state.

Figure 1C:
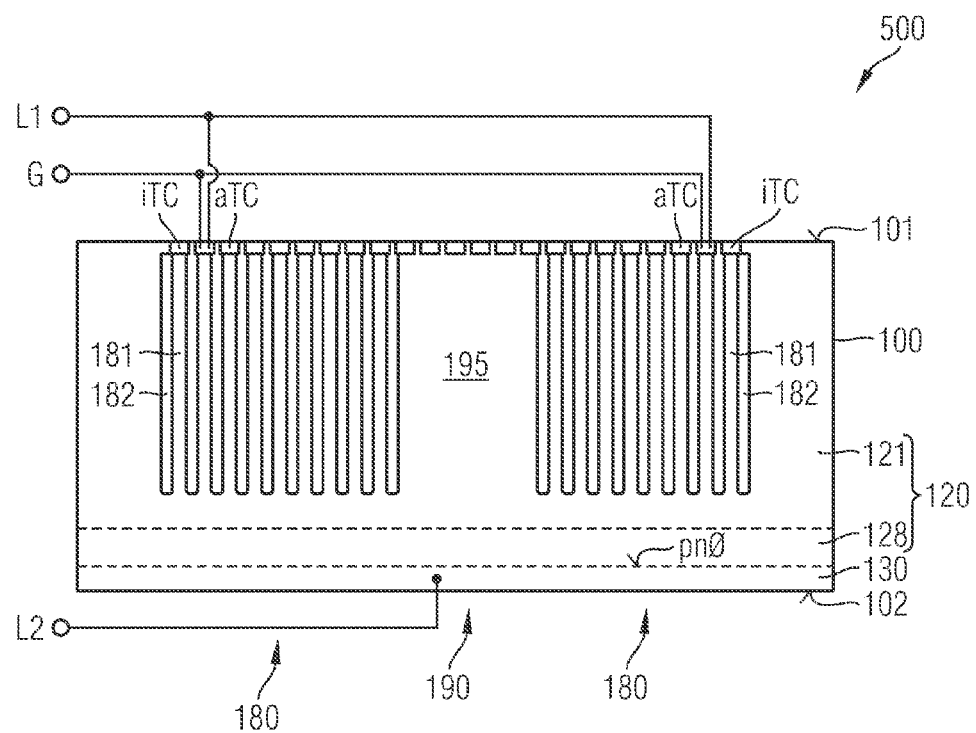
FIG. 1C is a schematic vertical cross-sectional view of the superjunction semiconductor device of FIG. 1A along line B-B according to one or more embodiments with no superjunction structure in the reservoir region.

FIGS. 1A to 1C refer to a semiconductor device 500 which is or includes a superjunction bipolar device, e.g. a SJ-IGBT or SJ-BT, an SJ-RCIGBT or a semiconductor device integrating any superjunction bipolar device and one or more further logic or analog circuits, e.g., a gate driver circuit and/or an overcurrent protection circuit.

The semiconductor device 500 is based on a semiconductor body 100 of a crystalline semiconductor material, for example silicon (Si), silicon carbide (SiC), germanium (Ge), silicon germanium (SiGe), gallium nitride (GaN), gallium arsenide (GaAs) or any other $A_{III}B_V$ semiconductor. At a front side the semiconductor body 100 has a first surface 101 which is planar or which is spanned by coplanar surface sections. A minimum distance between the first surface 101 and a planar second surface 102 at an opposite reverse side and parallel to the first surface 101 affects the voltage blocking capability of the semiconductor device 500 and may range from at least 20 μm to several 100 μm.

A normal to the first surface 101 defines a vertical direction and directions orthogonal to the vertical direction are horizontal directions. In the horizontal plane the semiconductor body 100 may have an approximately rectangular shape with an edge length in the range of several millimeters. An outer lateral surface 103 forms the edge of the semiconductor body 100 and connects the first and the second surfaces 101, 102. The outer lateral surface 103 may be vertical to the first and second surfaces 101, 102 or may be tilted at an angle smaller than 90 degree with respect to the first and second surfaces 101, 102. The outer lateral surface 103 may be straight or may include a recess.

The semiconductor body 100 includes a drain structure 120 of a first conductivity type. The drain structure 120 may include a weakly doped drift zone 121, which may be uniformly doped. According to another embodiment, a dopant concentration in the drift zone 121 may gradually or in steps increase or decrease with increasing distance to the first surface 101 at least in portions of its vertical extension. A mean dopant concentration in the drift zone 121 may be in a range from $1E12$ $cm^{-3}$ to $1E15$ $cm^{-3}$, for example in a range from $5E12$ $cm^{-3}$ to $5E13$ $cm^{-3}$.

The semiconductor body 100 further includes a collector structure 130 between the drain structure 120 and the second surface 102. The collector structure 130 may be a continuous layer of the second conductivity type, which is the opposite of the first conductivity type and forms one or more reverse side pn junctions pn0. According to embodiments related to RC-IGBTs, the collector structure 130 may include zones of both conductivity types. The dopant concentration in the collector structure 130 is sufficiently high to ensure a low ohmic contact to a metal structure adjoining the second surface 102. For example, a maximum dopant concentration in the collector structure 130 along the second surface 102 may be at least $1E17$ $cm^{-3}$, for example at least $5E18$ $cm^{-3}$.

In an active transistor cell area 610 of the semiconductor body 100 active transistor cells aTC, e.g., IGFET (insulated gate field effect transistor) cells are formed at the front side. The active transistor cells aTC are directly connected to both a first load terminal L1 and a gate terminal G. The active transistor cells aTC control a load current flow between the first load terminal L1 and a second load terminal L2, which is electrically connected to the collector structure 130. The active transistor cells aTC may be vertical transistor cells including planar gate structures formed outside of the semiconductor body 100 along the first surface 101 or trench gate structures extending from the first surface 101 into the semiconductor body 100.

A termination area 690 surrounds the active transistor cell area 610 and separates the active transistor cell area 610 from the outer lateral surface 103. The termination area 690 may include inactive transistor cells iTC, which may be connected to at most one of the first load terminal L1 and the gate terminal G.

A superjunction area 630 encloses all areas of the semiconductor body 100 in which superjunction structures 180, 190 may be formed. The superjunction area 630 completely includes the active transistor cell area 610 and may include an inner termination area 692, wherein an outer termination area 698 between the superjunction area 630 and the outer lateral surface 103 is devoid of any superjunction structures. The inner termination area 692 may include inactive transistor cells iTC.

Within the superjunction area 630 the semiconductor body 100 includes a low-resistive region 632 that includes a first superjunction structure 180 with first areas 181 of a first conductivity type and second areas 182 of a second conductivity type in the drain structure 120, wherein the first and second areas 181, 182 alternate along at least one horizontal direction. The doping concentrations in the first and second areas 181, 182 of the first superjunction structure 180 and the horizontal dimensions of the first and second areas 181, 182 are determined such that the charges of the dopants approximately cancel out and the total space charge in the depleted first and second areas 181, 182 is below the breakdown voltage of the semiconductor material of the drift zone 121, for example at most $2E12$ $cm^{-2}$ for silicon. A mean dopant concentration in the first areas 181 may be in a range from $1E14$ $cm^{-3}$ to $1E17$ $cm^{-3}$, for example in a range from $1E15$ $cm^{-3}$ to $1E16$ $cm^{-3}$. The first superjunction structure 180 has a first vertical extension v1.

The superjunction area 630 further includes a reservoir region 638, which may be one single region or which may include two or more spatially separated sub-regions.

According to the embodiment of FIG. 1B the reservoir region 638 may include a second superjunction structure 190 with first areas 191 of the first conductivity type and second areas 192 of the complementary second conductivity type in the drain structure 120, wherein the first and second areas 191, 192 alternate along at least one horizontal direction. The doping concentrations in the first and second areas 191, 192 of the second superjunction structure 190 and the horizontal dimensions of the first and second areas 191, 192 are determined such that the charges of the dopants approximately cancel out and the total space charge in the depleted first and second areas 191, 192 is below the breakdown voltage of the semiconductor material of the drift zone 121, for example at most $2E12$ $cm^{-2}$ for silicon.

A second vertical extension v2 of the second superjunction structure 190 is smaller than the first vertical extension v1 of the first superjunction structure 180. For example, v2 may be equal to 0 such that no superjunction structure is formed in the reservoir region 638 and the reservoir region 638 is devoid of any superjunction structure. A second distance d2 between the second superjunction structure 190 and the collector structure 130 may be greater than a first distance d1 between the first superjunction structure 180 and the collector structure 130.

In the reservoir region 638 a portion of the drain structure 120 without superjunction structure and outside of the second superjunction structure 190 forms a reservoir zone 195 of the first conductivity type. The reservoir zone 195 may have a dopant concentration equal to the dopant concentration in the drift zone 121 and equal to at most a fifth or at most a tenth of the mean dopant concentration in the first areas 181 of the first superjunction structure 180.

FIG. 1C refers to an embodiment with the reservoir region 638 being devoid of any superjunction structure and the reservoir zone 195 having a vertical extension equal to the first vertical extension v1 of the first superjunction structure 180.

In the reservoir zone 195 a dense charge carrier plasma forms in the on-state of the superjunction semiconductor device 500. When the superjunction semiconductor device 500 turns off, the charge carrier plasma in the reservoir zone 195 successively supplies charge carriers for a smooth switching behavior. Compared to charge carriers in the low-resistive region 632, charge carriers in the lightly doped reservoir zone 195 are drained off at a lower speed. As long as charge carriers are drained off, the voltage across the superjunction semiconductor device rises only slowly such that the rate of rise of $U_{CE}$ can be attenuated to an acceptable value of, for example 5 to 10 kV/μs. On the other hand, the low-resistive regions 632 keep the total switching and on-state losses low since charge carriers from these regions are drained off already at low voltage.

Figure 2A:
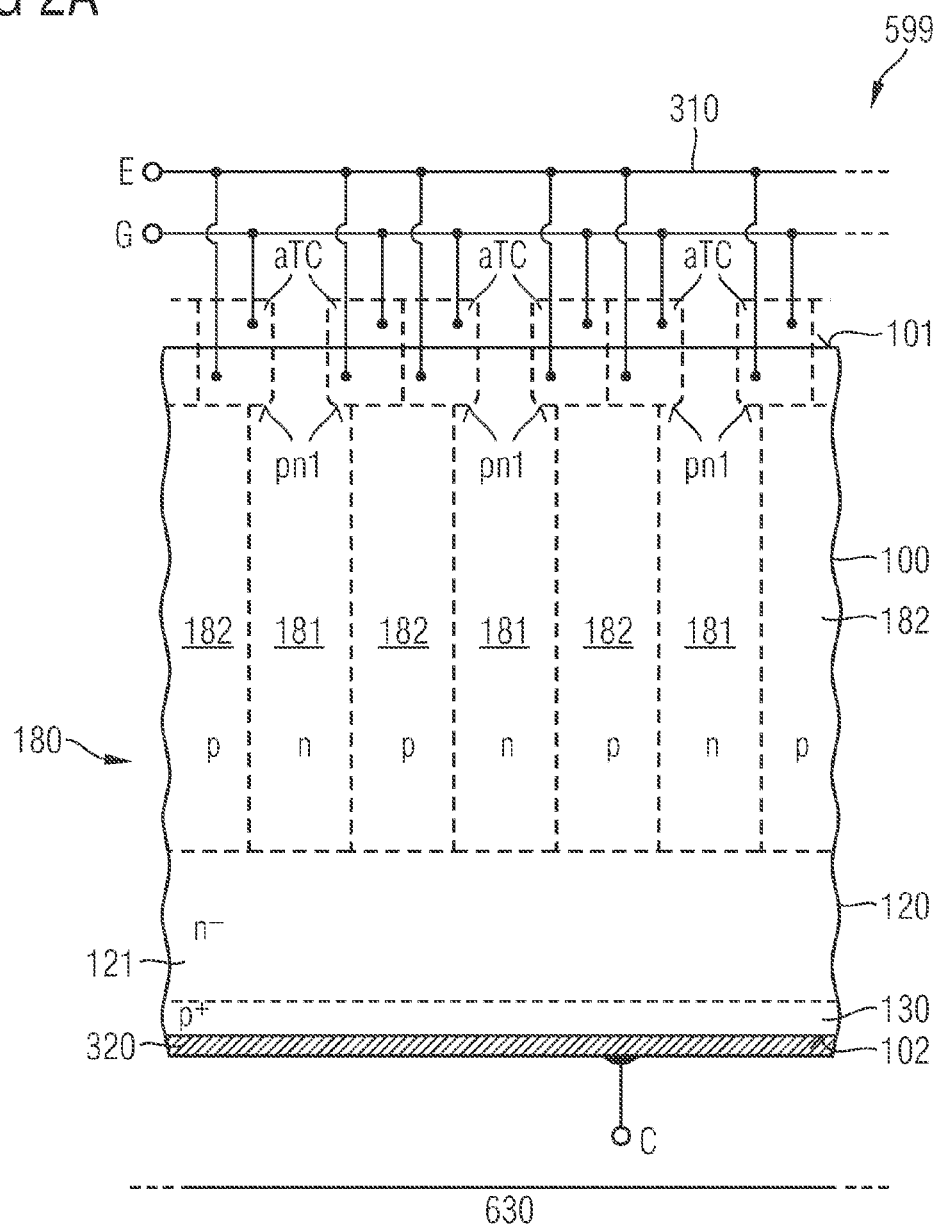
FIG. 2A is a schematic vertical cross-sectional view of a comparative device without reservoir region for discussing effects of one or more embodiments.
Figure 2B:
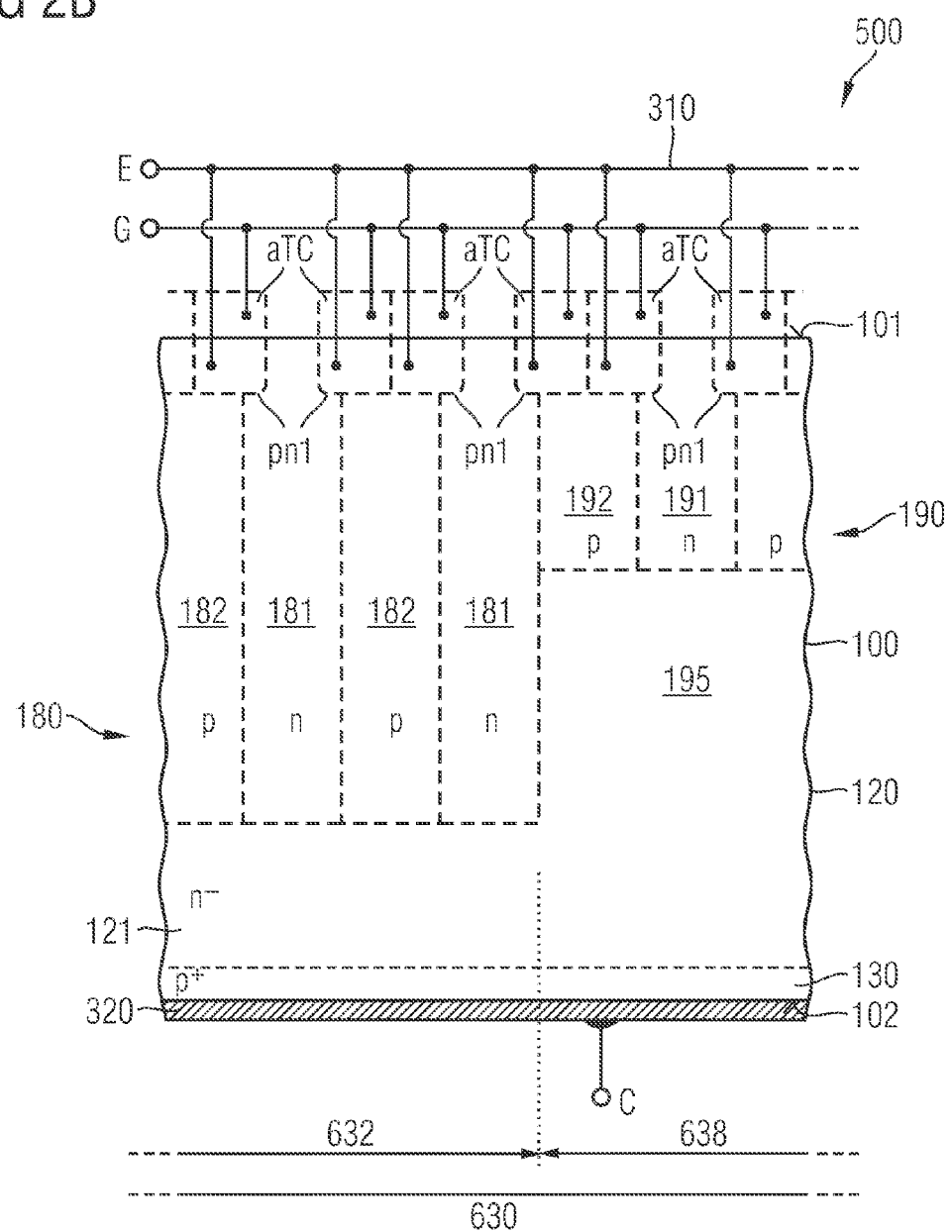
FIG. 2B is a schematic vertical cross-sectional view of a superjunction semiconductor device with reservoir region according to one or more embodiments for discussing effects of one or more embodiments.

Effects of the embodiments are in more detail discussed with reference to FIG. 2A showing a comparative device 599 and FIG. 2B schematically showing a superjunction semiconductor device 500 according to the embodiments.

The following description refers to n-channel active transistor cells aTC with n-type source zones, p-type body zones, n-type first areas 181, p-type second areas 182, n-type drift zone 121 and p-type collector structure 130. Equivalent considerations apply to complementary doped superjunction semiconductor devices with p-channel active transistor cells aTC.

The superjunction area 630 of the comparative device 599 illustrated in FIG. 2A includes one uniform superjunction structure 180 with alternatingly arranged first areas 181 and oppositely doped second areas 182. IGFET cells form active transistor cells aTC with body zones forming first pn junctions pn1 with the first areas 181 and second pn junctions with source zones. The source and body zones are directly connected to a first load electrode 310 at the front side, which may form or which may be electrically connected to an emitter terminal E. Gate electrodes of the active transistor cells aTC may be electrically connected or coupled to a gate terminal G. A collector structure 130 may be electrically connected to the second load electrode 320, which may form or which may be electrically connected to a collector terminal C.

The second areas 182 may be structurally connected with the body zones of the active transistor cells aTC or an oppositely doped intermediate zone may separate the body zones from the second areas 182 such that the second areas 182 float.

In case the second areas 182 are connected with the body zones 115 of the active transistor cells aTC, in the on-state holes injected from the collector structure 130 are drained off through the second areas 182 to the first load electrode 310 such that the charge carrier plasma density in portions of the drain structure 120 including the second areas 182 is comparatively low and the on-state voltage across the comparative device 599 is comparatively high.

In case the second areas 182 float, the corresponding minority charge carriers are not drained-off, the charge carrier plasma density is high and the resulting on-state voltage across the comparative device 599 is comparatively low.

When the comparative device 599 turns off, the charge carriers in the region of both the second areas 182 and the first areas 181 can be depleted at comparatively low collector-to-emitter voltage $U_{CE}$, wherein holes are drained off to the first load electrode 310 at the front side through the second areas 182 and electrons are drained off to the second load electrode 320 on the back through the first areas 181. Immediately after the mobile charge carriers have been drained off, the comparative device 599 can convey a higher voltage. Since the high conductivity in the first and second areas 181, 182 facilitate a fast depletion of the mobile charge carriers, the transition from the high-current/low-voltage phase to the no-current/high-voltage phase is abrupt and the rate of rise of $U_{CE}$ can reach values up to 100 kV/μs and more.

Steep transitions are typically not desired in an electronic circuit, because the steep change results in ringing and voltage peaks that have to be handled by the other components of the electric circuit of the application. Further, process variations may result in variations of the degree of compensation within the superjunction structure 180 such that some of the manufactured comparative devices 599 may be slightly p-loaded while others may be slightly n-loaded. In p-loaded comparative devices 599 at first the charge carriers at the front side are drained off, whereas in slightly n-loaded comparative devices 599 at first areas far from the first load electrode 310 are depleted. The significant difference in both mechanisms results in a strong spread of the switching parameters.

Increasing the distance of the superjunction structure 180 to the collector structure 130 lengthens the high-impedance path in the drain structure 120 and increases the total switching losses, since in the portion of the drift zone 121 between the superjunction structure 180 and the collector structure 130 or between the superjunction structure 180 and a field stop layer 128 the mobile charge carriers are drained off only at comparatively high voltages.

Increasing the dopant concentrations in intermediate zones separating the body zones of the active transistor cells aTC from the second areas 182 results in that the depletion zone reaches the second areas 182 only at a comparatively high blocking voltage. But as soon as the depletion zone reaches the second areas 182 the charge carriers are drained off at only little additional voltage, whereas the following portion of the rising edge of the blocking voltage gets comparatively steep.

The superjunction semiconductor device 500 of FIG. 2B distinguishes from the comparative device 599 of FIG. 2A in that in addition to a low-resistive region 632 with a first superjunction structure 180 similar to that of the comparative device 599 of FIG. 2A it includes a reservoir region 638, in which the drain structure 120 includes a reservoir zone 195 in which no superjunction structure is formed. The dopant concentration of the reservoir zone 195 may correspond to that of the drift zone 121 and is significantly lower than in the first areas 181 of the first superjunction structure 180. The reservoir region 638 may also include a second superjunction structure 190 with a smaller vertical extension than the first superjunction structure 180.

In the on-state of the superjunction semiconductor device 500 the first pn junctions pn1 get transparent for electrons and electrons passing the first pn junctions pn1 between the body zones and the first areas 181 as well as holes injected from the collector structure 130 form a dense charge carrier plasma in the drain structure 120.

When the gate voltage falls below a gate threshold voltage and the superjunction semiconductor device 500 turns off, in the low-resistive region 632 holes are drained off through the second areas 182 to the front side and electrons are drained off through the collector structure 130 to the reverse side such that the low-resistive region 632 is depleted at a comparatively high speed and at low voltage. Due to the higher resistivity of the reservoir region 638 a discharge of the charge carriers from the reservoir zone 195 occurs at a much higher voltage and delays both the trailing edge of the collector current $I_C$ and the rising edge of the blocking voltage $U_{CE}$.

The area portion of the reservoir region 638 can be tailored to match the specifications for the rate of rise of $U_{CE}$ such that the overall switching losses are as low as possible for a certain rate of rise of $U_{CE}$. The reservoir regions 638 may be formed in any portion within the superjunction area 630.

Figure 3A:
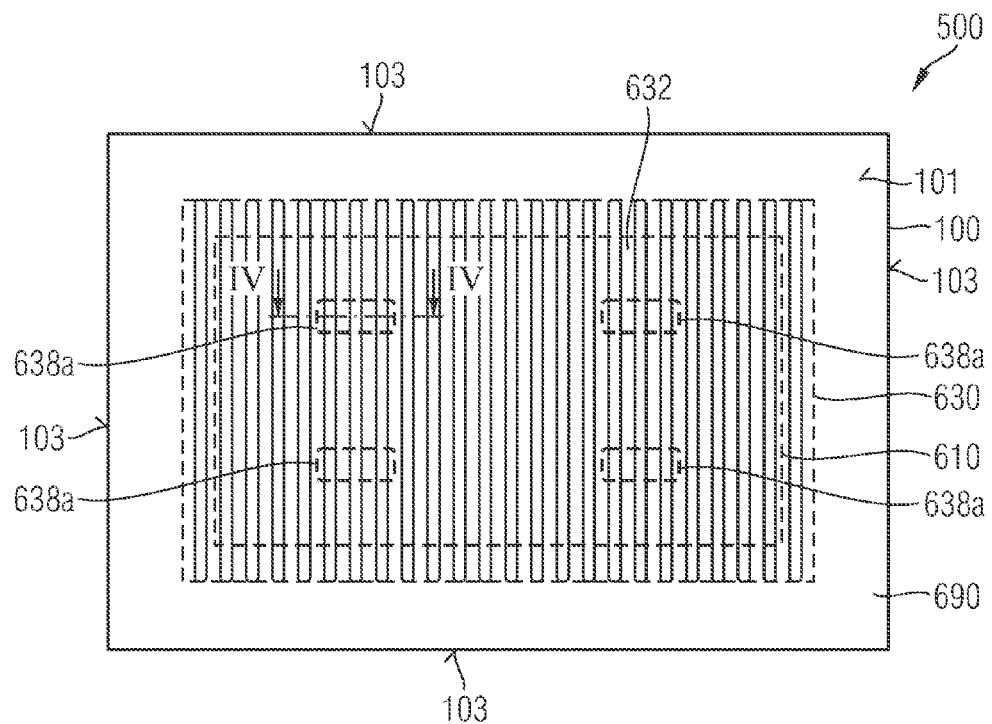
FIG. 3A is a schematic plan view of a superjunction semiconductor device according to one or more embodiments, wherein the reservoir region includes spatially separated sub-regions within an active transistor cell area.

FIG. 3A shows a reservoir region 638 including several isolated sub-regions 638a within the active transistor cell area 610. The sub-regions 638a may be formed symmetrically with respect to one horizontal center axis of the active transistor cell area 610 or with respect to two orthogonal horizontal center axes of the active transistor cell area 610.

Horizontal cross-sectional areas of the reservoir regions 638 or the sub-regions 638a may be polygons such as squares, rectangles, regular or distorted hexagons or octagons, stripes, circles, ovals or ellipses. Sub-portions 638a may be equally distributed across the active transistor cell area 610 and may be aligned to a regular grid. According to other embodiments, an area portion of the reservoir region 638 may increase or decrease with decreasing distance to the termination area 690.

Figure 3B:
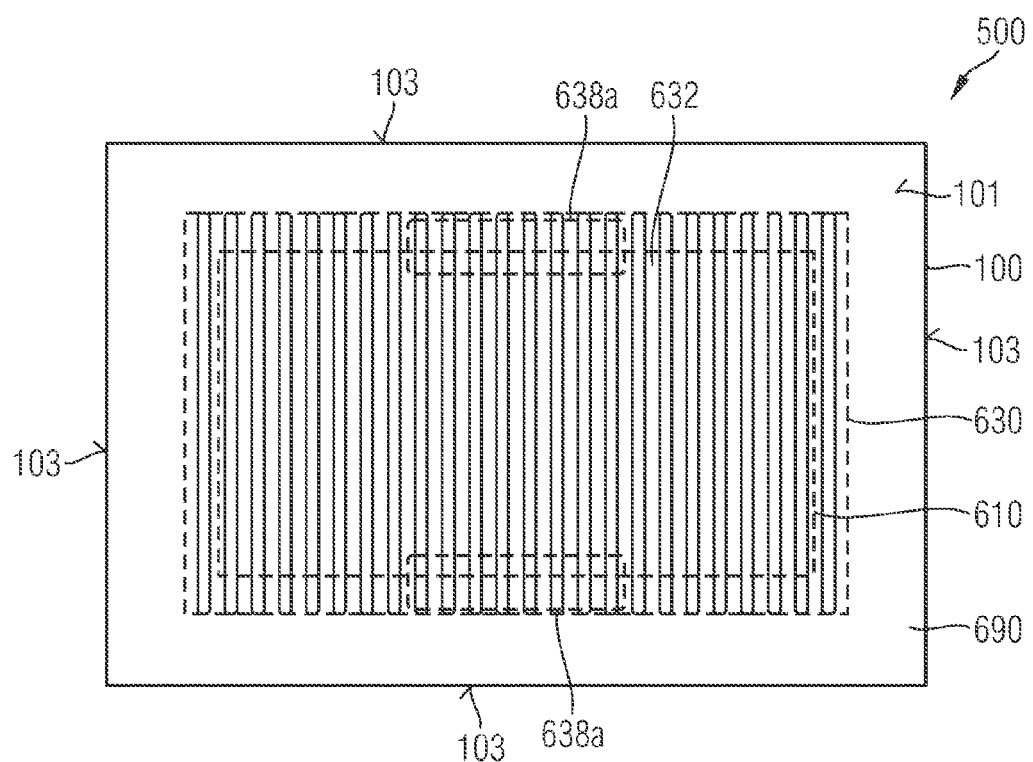
FIG. 3B is a schematic plan view of a superjunction semiconductor device according to one or more embodiments, wherein the reservoir region is partly formed in a termination area surrounding the active transistor cell area.

In FIG. 3B, the reservoir region 638 includes two isolated sub-regions 638a wherein each sub-region 638a overlaps with both the active transistor cell area 610 and the termination area 690. According to other embodiments, the sub-regions 638a may be formed exclusively in the termination area 690. According to another embodiment, the reservoir region 638 may be formed exclusively in the active transistor cell area 610.

Figure 3C:
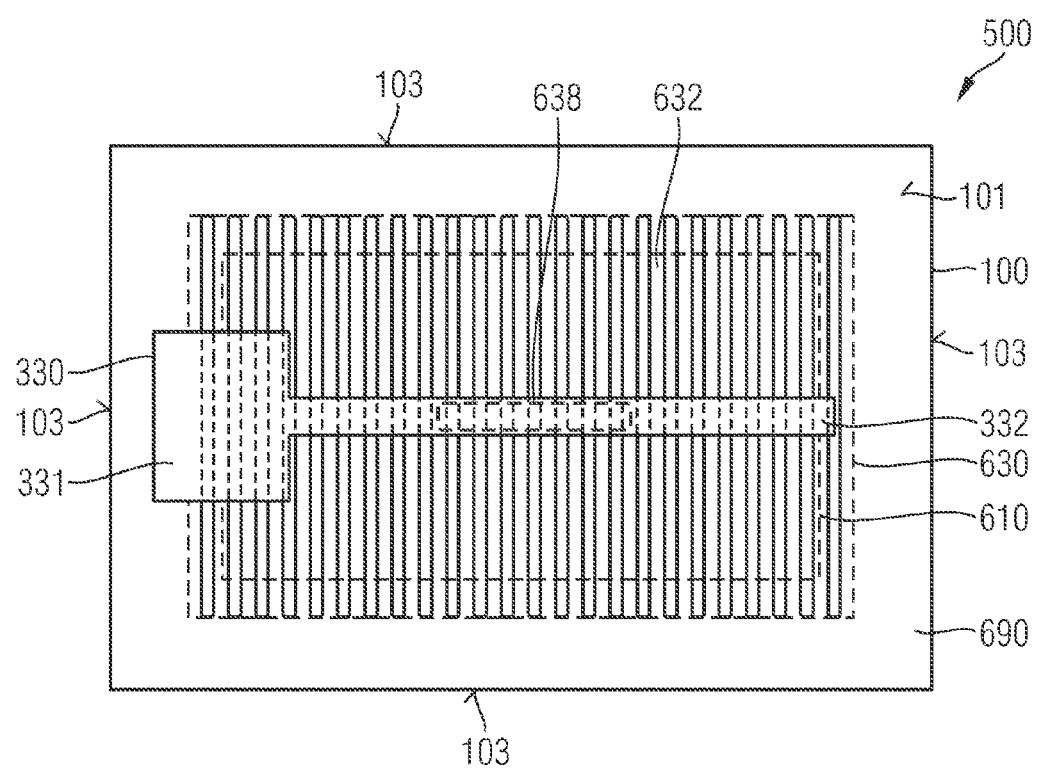
FIG. 3C is a schematic plan view of a superjunction semiconductor device according to one or more embodiments, wherein the reservoir region is formed in the vertical projection of a gate connection structure within the active transistor cell area.

The superjunction semiconductor device 500 of FIG. 3C includes a gate conductor structure 330 on the first surface 101. The gate conductor structure 330 may include a gate pad 331, which may form a gate terminal of the superjunction semiconductor device 500 or which may form a bond pad for a bond wire electrically connecting the gate pad with the gate terminal. The gate conductor structure 330 may further include a gate finger 332 electrically connecting gate electrodes of a plurality of active transistor cells aTC. The reservoir region 638 may be exclusively formed in a vertical projection of a portion of the gate conductor structure 330 or may at least overlap with a vertical projection of the gate conductor structure 330.

FIGS. 4A to 4C refer to vertical cross-sectional views of a portion of the superjunction semiconductor device 500 of FIG. 3A along line IV-IV. The superjunction semiconductor device 500 includes a field stop layer 128 of the first conductivity type sandwiched between the drift zone 121 and the collector structure 130. A mean dopant concentration in the field stop layer 128 may be at least three times, for example at least ten times as high as the dopant concentration in the drift zone 121.

In FIG. 4A the reservoir region 638 includes a second superjunction structure 190 with a mean second vertical extension v2 smaller than a first vertical extension v1 of the first superjunction structure 180 in the low-resistive region 632. For example, the mean second vertical extension v2 is at most 90%, for example at most 50% of the first vertical extension v1.

A first distance d1 between the first and second areas 181, 182 and the collector structure 130 is smaller than a mean second distance d2 between the first and second areas 191, 192 and the collector structure 130. A center-to-center distance between neighboring first areas 191 of the second superjunction structure 190 may be equal to or may differ from the center-to-center distance between neighboring first areas 181 of the first superjunction structure 180.

A reservoir zone 195 is formed in the volume of the semiconductor body 100 in the reservoir region 638 between the first and second areas 191, 192 of the second superjunction structure 190 at one side and a plane spanned by the buried edges of the first and second areas 181, 182 of the first superjunction structure 180 oriented to the second surface 102 at the other side. The reservoir zone 195 is of the first conductivity type and may have a dopant concentration significantly lower than a dopant concentration in the first areas 191 of the second superjunction structure 190. For example, the dopant concentration in the reservoir zone 195 is at most a fifth or at most a tenth of the dopant concentration in the first areas 191 of the second superjunction structure 190. For example, the dopant concentration in the reservoir zone 195 is in a range from 1E12 cm$^{-3}$ to 1E15 cm$^{-3}$, for example in a range from 5E12 cm$^{-3}$ to 5E13 cm$^{-3}$.

In FIG. 4B the reservoir region 638 is devoid of any superjunction structure and the reservoir zone 195 extends between a plane spanned by a buried edge of the active transistor cells aTC at one side and a plane spanned by the buried edge of the first superjunction structure 180 in the low-resistive region 632 at the other side.

In the superjunction semiconductor device 500 of FIG. 4C the reservoir region 638 includes a central section 638x in which the vertical extension of the first and second areas 191, 192 of the second superjunction structure 190 has a minimum value, as well as a transition section 638y in which the vertical extensions of the first and second areas 191, 192 of the second superjunction structure 190 gradually change from the first vertical extension v1 to the second vertical extension v2. The transition section 638y may include first and second areas 191, 192 of the same vertical extension or with different vertical extensions, as illustrated.

FIGS. 5A to 5D illustrate the effect of the reservoir zone 195 of the superjunction semiconductor device 500 of FIG. 4A.

In the on-state, a gate potential applied at the gate terminal G exceeds a threshold voltage of the active transistor cells aTC at which inversion channels formed along a gate dielectric connect n-type source zones with the n-type first areas 181, 182 and electrons flood the drain structure 120. The electrons are effective as base current for the pnp bipolar junction transistor formed from the p-type body zones of the active transistor cells aTC, n-type portions of the drain structure 120 and the p-type collector structure 130, wherein the collector structure 130 injects holes into the drain structure 120. A bipolar load current results that flows in vertical direction between the first load electrode 310 electrically connected to the emitter terminal E and the second load electrode 320 electrically connected to the collector terminal C.

Figure 5B:
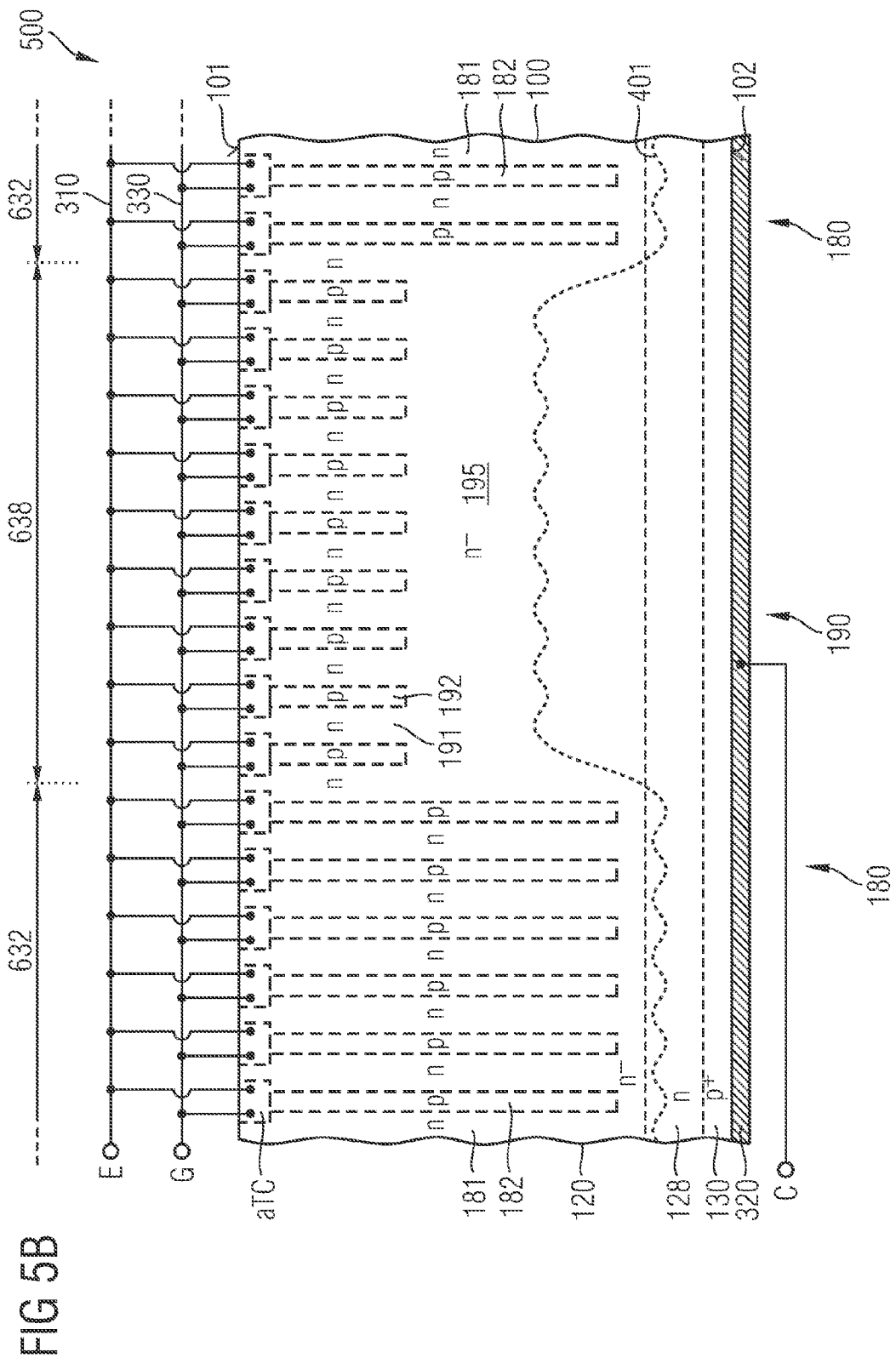
FIG. 5B is a schematic vertical cross-sectional view of the superjunction semiconductor device of FIG. 4A and showing the boundary of the depletion zone at a second point in time after switching off the superjunction semiconductor device, for illustrating effects of the embodiments.
Figure 5D:
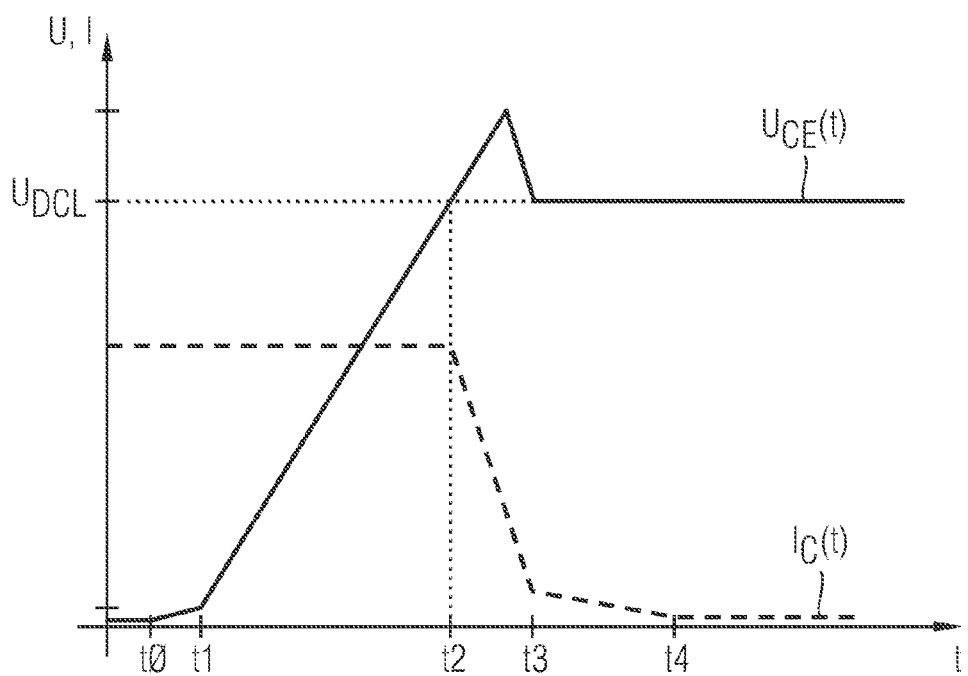
FIG. 5D is a schematic time chart illustrating the rising edge of a collector-to-emitter voltage $U_{CE}$ and the falling edge of a collector current $I_C$ of the superjunction semiconductor device of FIGS. 5A to 5C during turning-off.

FIG. 5D shows a high collector current $I_C$ and a low collector-to-emitter voltage $U_{CE}$ for t<t0. At t=t0 the gate voltage falls below the threshold voltage and the superjunction semiconductor device 500 begins to turn off.

Directly after t=t0 mobile charge carriers are still present in the drain structure 120 and keep flowing to the load electrodes 310, 320 thereby maintaining the full load current for a certain period of time. Holes are drained off through the second areas 182, 192 to the front side and electrons are drained off through the first areas 181, 191 to the reverse side. Since the first and second areas 181, 191, 182, 192 are heavily doped and have a low resistance, electrons and holes are quickly depleted from both the first and second superjunction structures 180, 190 at a comparatively low $U_{CE}$.

FIG. 5A shows a boundary 401 of the depletion zone after the superjunction structures 180, 190 have been completely depleted at t=t1.

For t1<t<t2, $U_{CE}$ increases at a faster rate than for t0<t<t1. The rate of rise dU/dt of $U_{CE}$ can be defined by dimensions of and dopant concentration in the reservoir zone 195 and is smaller than the rate of rise of a comparative device without reservoir zone 195.

The charge carriers depleted from the reservoir zone 195 may still convey the full load current $I_L$ for a certain period of time, whereby $U_{CE}$ steadily increases. When $U_{CE}$ exceeds a DC link voltage UDCL at t=t2, in typical applications of IGBTs, e.g., in a half-bridge circuit, a free-wheeling diode starts to supply the load current drawn by the load and the collector current $I_C$ begins to decrease.

FIG. 5B shows the position of the boundary 401 of the depletion zone for a point in time between t1 and t2 when the superjunction structures 180, 190 and a portion of the reservoir zone 195 oriented to the front side are fully depleted.

At t=t4 the collector current $I_C$ finally corresponds to the leakage current flowing in the off-state. For t3<t<t4 the collector current $I_C$ may gradually decrease and supply a tail current the amount of which depends on the DC link voltage UDCL and the depletion state of the reservoir zone 195.

FIG. 5C shows the boundary 401 of the depletion zone at t=t3, when the reservoir zone 195 is almost completely depleted, the collector current IC is close to the leakage current and the superjunction semiconductor device 500 has its full voltage blocking capability.

At a suitable area ratio between reservoir region 638 and low-resistive region 632 switching softness for turning off may be improved since the reservoir zones 195 may provide a sufficiently large tail current at the end of turning off.

FIGS. 6A to 6G refer to embodiments directed to RC-IGBTs.

The superjunction semiconductor device of FIG. 6A is an RC-IGBT or includes an RC-IGBT which integrates a distributed diode portion in the same semiconductor body 100 in which an IGBT portion is formed. To this purpose, the collector structure 130 includes both heavily p$^+$-doped IGBT zones 131 supporting the IGBT functionality and heavily n$^+$-doped diode cathode zones 132 supporting the diode functionality. The IGBT zones 131 and the diode cathode zones 132 may be evenly distributed or the area ratio of either the IGBT zones 131 or the diode cathode zones 132 may decrease with decreasing distance to a termination area. The collector structure 130 may also include a large heavily p$^+$-doped pilot zone for improving on-state characteristics of the IGBT portion. The area portions of IGBT zones 131 and diode cathode zones 132 may be the same in the reservoir region 638 and at least adjoining portions of the low-resistive region 632.

FIG. 6B shows the diode cathode zones 132 exclusively or at least predominantly formed within the reservoir region 638 to improve the commutation behavior of the diode portion. As regards commutation, the same considerations as outlined above for the IGBT functionality apply also to the diode functionality. Forming the diode cathode zones 132 predominantly in the reservoir region 638 predominantly affects the diode functionality, whereas the IGBT functionality remains almost unaffected.

In FIG. 6C weakly n$^-$-doped zones 132a replace the IGBT zones 131 in at least portions of the reservoir region 638, such that the diode region includes no or only few IGBT zones 131 and parasitic effects of the IGBT zones 131 on the diode functionality are significantly reduced. For example, the diode output characteristic may to a higher degree get independent from the gate voltage applied to the active transistor cells aTC in the low-resistive region 632 as described below in conjunction with FIG. 6F.

While in the superjunction semiconductor device 500 of FIG. 6C weakly n$^-$-doped zones 132a separate the heavily doped diode cathode zones 132, the collector structure 130 of FIG. 6D includes one continuous heavily n$^+$-doped diode cathode zone 132 within the reservoir region 638.

Figure 6E:
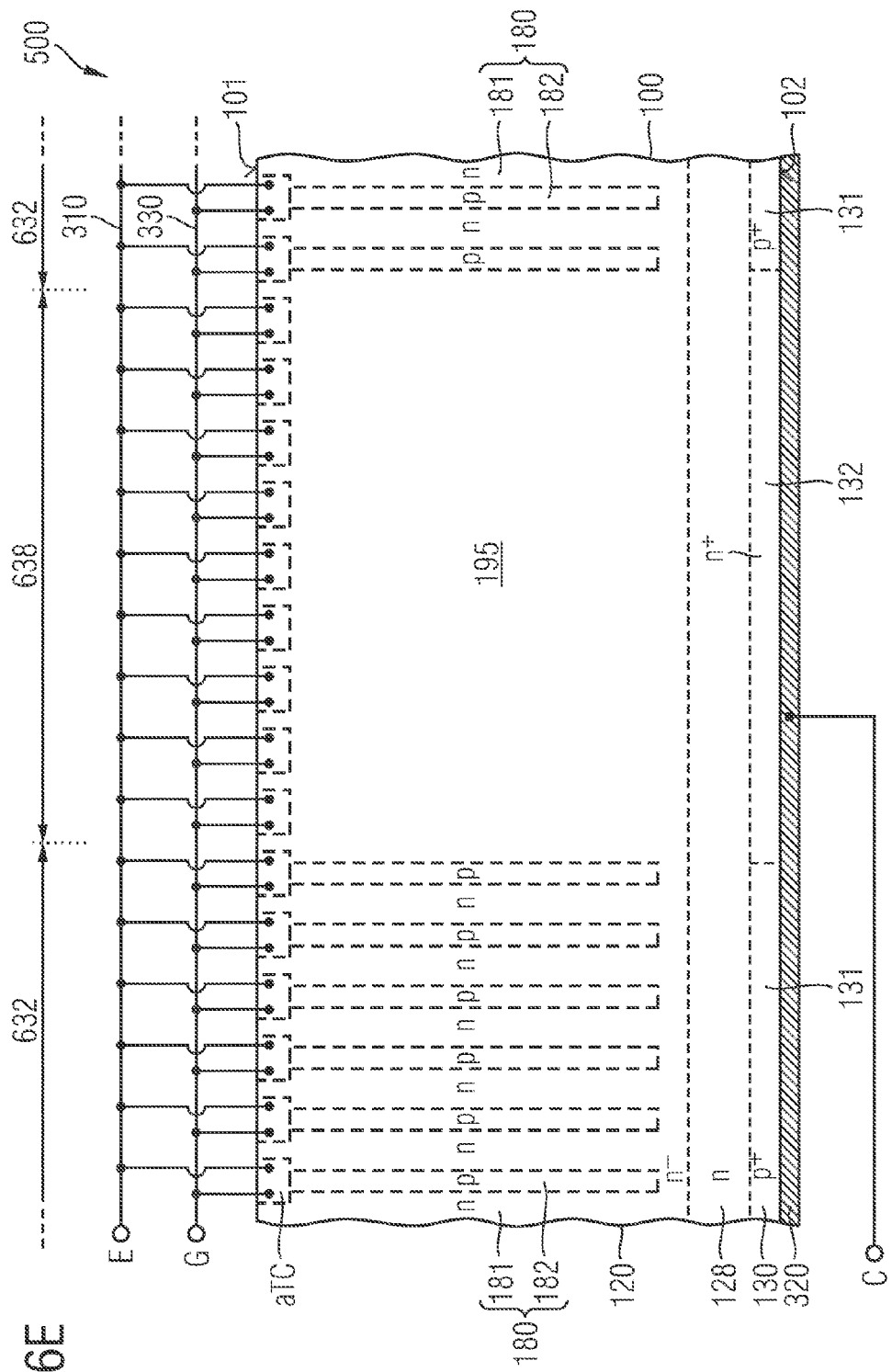
FIG. 6E is a schematic vertical cross-sectional view of a portion of a superjunction RC-IGBT with a homogenously doped diode cathode zone of a diode portion spanning across the complete reservoir region according to one or more embodiments.

In FIG. 6E the diode cathode zone 132 extends across the complete reservoir region 638 such that the whole reservoir region 638 is effective as diode region. In this case the reservoir zone 195 has only low impact on the IGBT functionality and more or less only the diode region benefits from the reservoir zone 195. Often, RC-IGBTs are implemented in resonant electric circuits in which the current value and the capacity of the resonant circuit determine the rate of rise dU/dt of $U_{CE}$ such that the above discussed effects of hard switching are of less relevance.

Figure 6F:
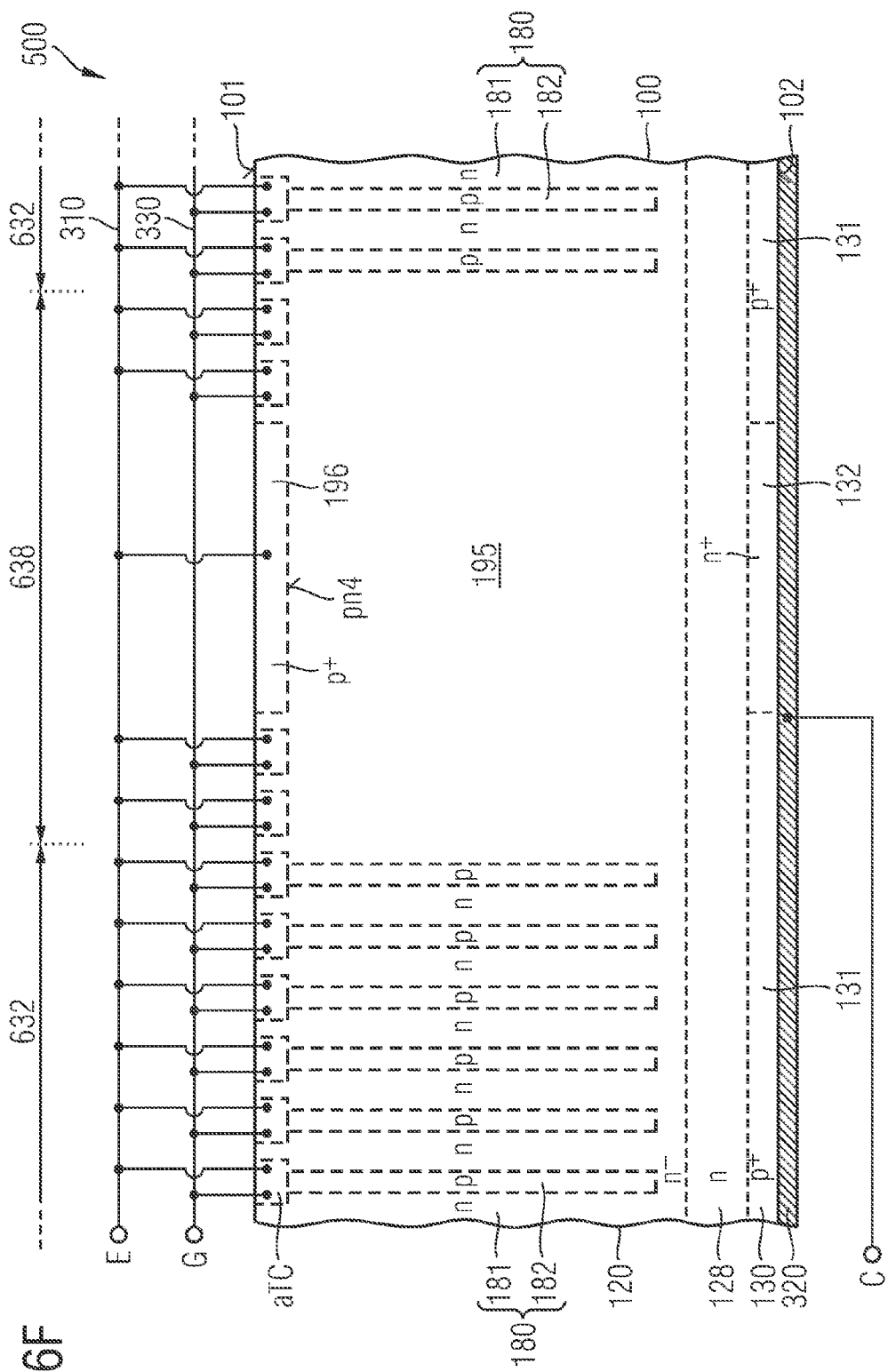
FIG. 6F is a schematic vertical cross-sectional view of a portion of a superjunction RC-IGBT with a homogenously doped diode cathode zone and a diode anode zone of a diode portion exclusively formed within the reservoir region according to one or more embodiments.

The superjunction semiconductor device 500 of FIG. 6F combines the diode cathode zone 132 of FIG. 6D with a p-type diode anode zone 196 replacing some of the active transistor cells aTC in the reservoir region 638 in a vertical projection of the diode cathode zone 132. Replacing the active transistor cells aTC in the diode region with the diode anode zone 196 further reduces the influence of the gate voltage on the diode output characteristics.

Dopant concentrations and depth of the dopant profile of the diode anode zone 196 and the reservoir zone 195 may be selected such that in the blocking state a diode pn junction pn4 between the diode anode zone 196 and the reservoir zone 195 generates a higher electric field than the first pn junctions pn1 between the body zones of the active transistor cells aTC and the first areas 181 of the first superjunction structure 180. As a consequence, avalanche breakdown is pinned in the area of the diode anode zones 196 and either avalanche ruggedness may be improved compared to an RC-IGBT with the same vertical extension of the drain structure 120 or the vertical extension of the drain structure 120 may be reduced without loss of avalanche ruggedness.

FIG. 6G combines the embodiment of the diode cathode zone 132 of FIG. 6E with a diode anode zone 196 replacing all active transistor cells aTC in the reservoir region 638.

At least the drain structure 120 of the semiconductor body 100 may include recombination centers 197 reducing charge carrier lifetime of mobile charge carriers as illustrated in FIG. 7.

The recombination centers 197 may be crystal defects generated by exposure to a particle beam, e.g. an electron beam, or may be metal atoms such as platinum (Pt) or gold (Au), wherein the metal atoms may be gettered at crystal defects. Reducing charge carrier lifetime may improve switching behavior of the superjunction semiconductor device 500, because less charge carriers have to be drained off when the device changes from a conducting state to a blocking state. A mean density of recombination centers 197 in the reservoir region 638 may be significantly lower than a mean density of recombination centers in the low-resistive region 632 such that the impact of the recombination centers 197 on the reservoir zone 195 is low.

The superjunction semiconductor device 500 of FIG. 8A includes counter-doped islands 198 formed between the superjunction structures 180, 190 and the collector structure 130. According to an embodiment the counter-doped islands 198 may directly adjoin to or may be embedded in the field stop layer 128. Dopant concentration and dimensions of the counter-doped islands 198 are selected such that at high current densities avalanche breakdown takes place along the counter-doped islands 198. During avalanche breakdown, the counter-doped islands 198 supply additional free charge carriers in a critical phase of the switching process. The counter-doped islands 198 may be exclusively or at least mainly formed in the low-resistive region 632.

The effect of the reservoir zone 195 approximates the effect of a local enhanced backside emitter, where enhanced IGBT zones with locally enhanced emitter efficiency supply sufficient charge carriers for a sufficient tail current during turning-off. Other than in conventional locally enhanced backside emitters, the collector structure 130 can be homogeneous and can be formed without further lithography process. The homogeneous collector structure 130 further provides a homogeneous injection of holes across the complete chip area and counteracts a local enhancement of the electric field near the collector structure 130, which may be triggered by high electron current densities in the short-circuit case. As a result, the reservoir zone 195 may achieve a similar effect as locally enhanced backside emitters at less manufacturing effort and at improved short-circuit ruggedness.

According to FIG. 8B the reservoir zone 195 may be combined with local enhanced backside emitter zones 139, which dopant concentration is higher than in the IGBT zones 131, to adjust a trade-off between short-circuit ruggedness and switching softness.

The functionality of the reservoir zone 195 may be combined with any type of active transistor cells aTC.

The superjunction semiconductor device 500 of FIG. 9A is based on a semiconductor body 100 with a first superjunction structure 180 with oppositely doped first and second areas 181, 182 and a second superjunction structure 190 with oppositely doped first and second areas 191, 192. A reservoir zone 195 extends between a buried edge of the second superjunction structure 190 and a plane spanned by the buried edge of the first superjunction structure 180 at the reverse side.

P-type wells including body zones 115 of pairs of active transistor cells aTC are formed in the vertical projection of the second areas 182, 192, respectively. The p-type wells may horizontally extend into the vertical projection of the n-type first areas 181, 191. The body zones 115 form first pn junctions pn1 with the n-type first areas 181, 191 and separate the first areas 181 from n-type source zones 110, which may be formed as wells extending from the first surface 101 into the p-type well including the body zones 115.

Gate structures 150 may be formed on the first surface 101. The gate structures 150 include a conductive gate electrode 155 and a gate dielectric 151 separating the gate electrode 155 at least from the body zones 115 formed in the semiconductor body 100. The gate electrode 155 may be a homogeneous structure or may have a layered structure including one or more metal containing layers. According to an embodiment, the gate electrode 155 may include or consist of a heavily doped polycrystalline silicon layer.

The gate dielectric 151 may have uniform thickness and may include or consist of a semiconductor oxide, for example thermally grown or deposited silicon oxide, a semiconductor nitride, for example deposited or thermally grown silicon nitride, or a semiconductor oxynitride, for example silicon oxynitride or any combination thereof.

An interlayer dielectric 210 may insulate the gate electrodes 155 from a first load electrode 310. The interlayer dielectric 210 may include one or more dielectric layers from silicon oxide, silicon nitride, silicon oxynitride, doped or undoped silicate glass, for example BSG (boron silicate glass), PSG (phosphorus silicate glass) or BPSG (boron phosphorus silicate glass), by way of example.

Contact structures 315 extending through openings in the interlayer dielectric 210 may electrically connect the first load electrode 310 with the body zones 115 and the source zones 110. The first load electrode 310 may be or may be electrically coupled or connected to a first load terminal, for example to the emitter terminal E of an n-IGBT.

A portion of a drift zone 121 may separate the first superjunction structure 180 and the reservoir zone 195 from a field stop layer 128. A collector structure 130 is sandwiched between the field stop layer 128 and a second load electrode 320 at the reverse side of the semiconductor body 100.

The second load electrode 320, which directly adjoins to the second surface 102 and to the collector structure 130, may form or may be electrically connected to a second load terminal, which may be the collector terminal C of an n-IGBT.

Each of the first and second load electrodes 310, 320 may consist of or contain, as main constituent(s), aluminum (Al), copper (Cu), or alloys of aluminum or copper, for example AlSi, AlCu or AlSiCu. According to other embodiments, at least one of the first and second load electrodes 310, 320 may contain, as main constituent(s), nickel (Ni), titanium (Ti), tungsten (W), tantalum (Ta), vanadium (V), silver (Ag), gold (Au), platinum (Pt), and/or palladium (Pd). For example, at least one of the first and second load electrodes 310, 320 may include two or more sub-layers, wherein each sub-layer contains one or more of Ni, Ti, V, Ag, Au, Pt, W, and Pd as main constituent(s), e.g., a silicide, a nitride and/or an alloy.

The p-type second areas 182, 192 may be structurally connected with the p-type wells including the body zones 115 such that p-type charge carriers are effectively drained off from a center portion of the semiconductor body 100 to the front side.

Figure 9B:
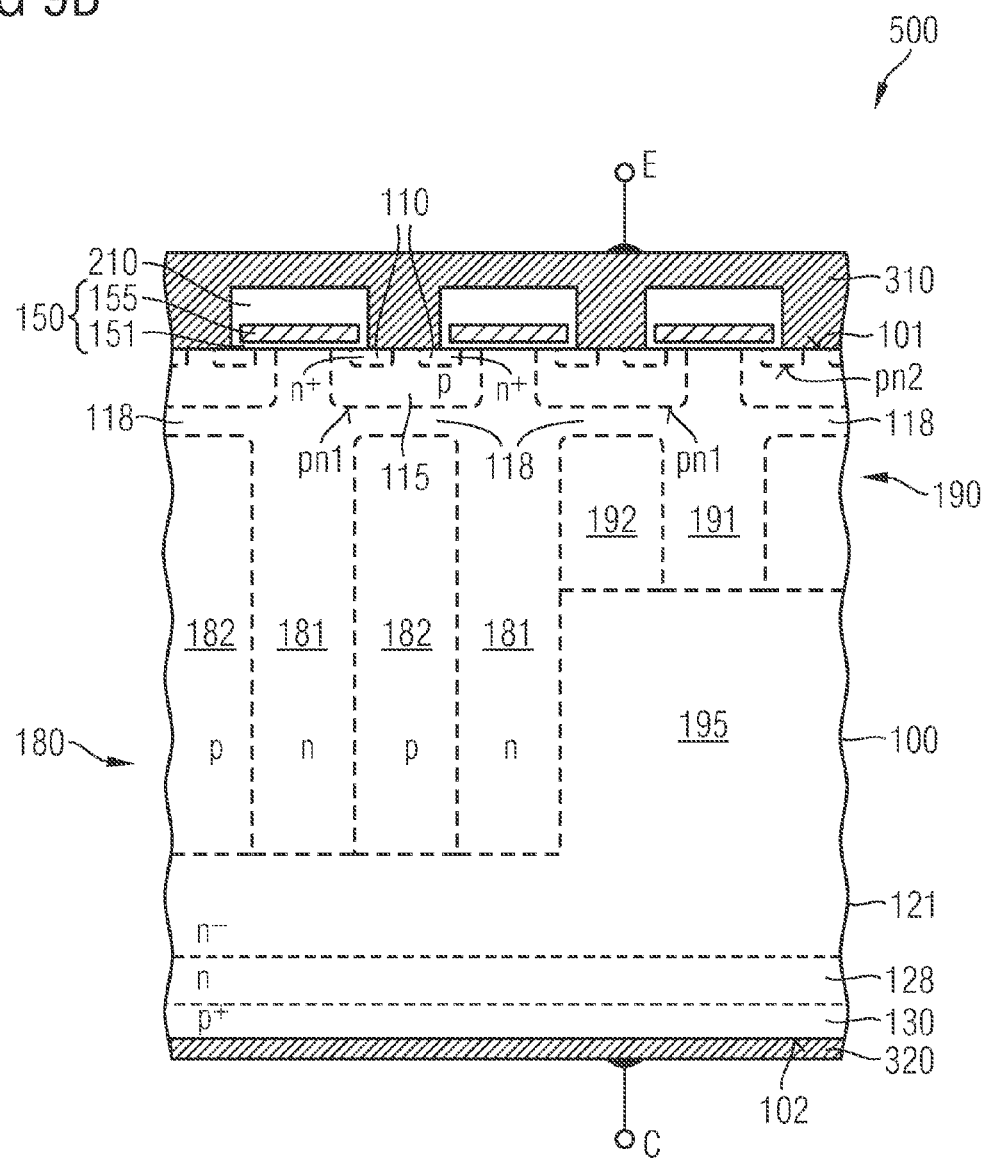
FIG. 9B is a schematic vertical cross-sectional view of a portion of a superjunction semiconductor device including transistor cells with planar gate structures and floating second areas according to one or more embodiments.

In FIG. 9B an n-type intermediate layer 118 separates the p-type wells including the body zones 115 from the second areas 182, 192 to delay the depletion of holes from a center portion of the semiconductor body 100.

Figure 9C:
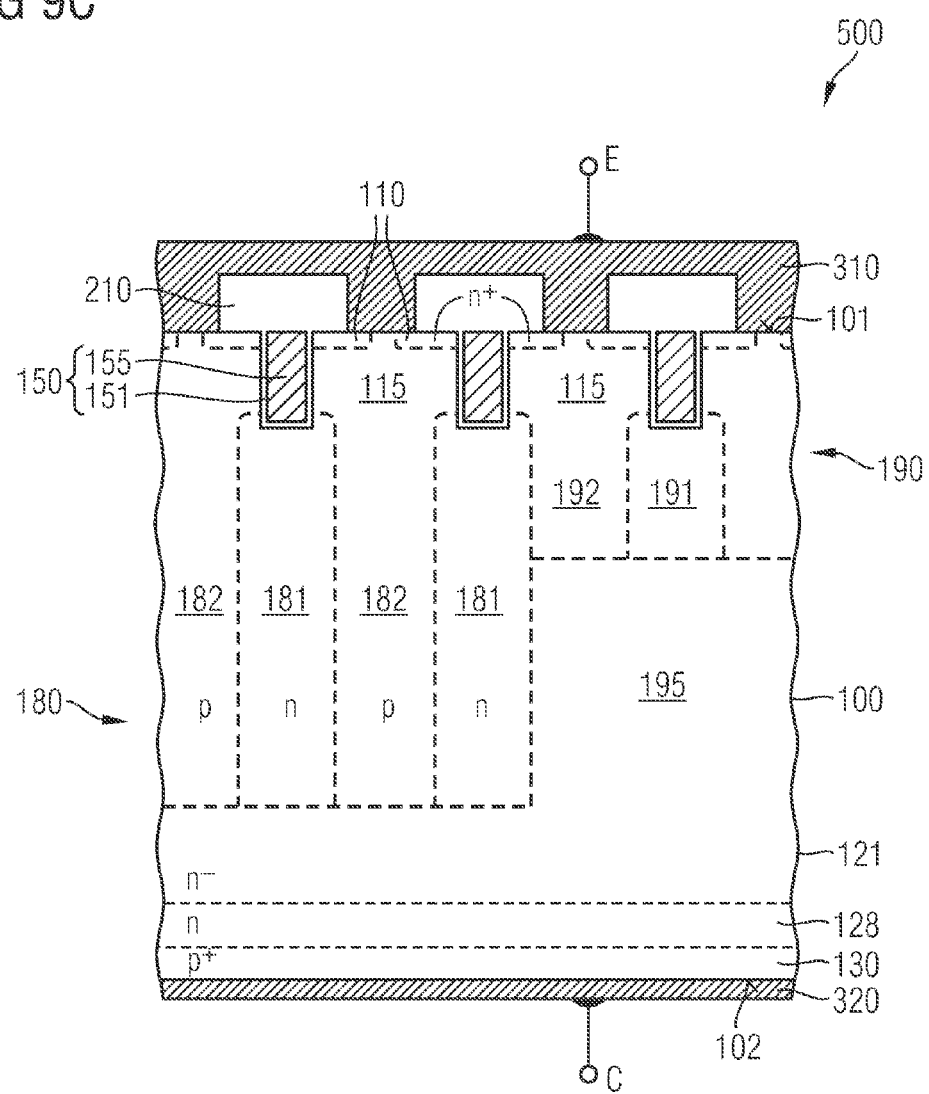
FIG. 9C is a schematic vertical cross-sectional view of a portion of a superjunction semiconductor device including transistor cells with trench gate structures according to one or more embodiments.

In FIG. 9C the gate structures 150 are formed as trench gate structures extending from the first surface 101 into the semiconductor body 100. According to the illustrated embodiment, the gate structures 150 are formed in the vertical projection of the n-type first areas 181, 191. P-type body zones 115 are formed in a p-type layer and extend between neighboring gate structures 150.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A superjunction bipolar transistor, comprising:
an active transistor cell area comprising active transistor cells electrically connected to a first load electrode at a front side of a semiconductor body; and
a superjunction area overlapping the active transistor cell area, the superjunction area comprising a low-resistive region and a reservoir region outside of the low-resistive region, wherein the low-resistive region comprises a first superjunction structure with a first vertical extension with respect to a first surface at the front side of the semiconductor body, and wherein the reservoir region comprises a second superjunction structure with a mean second vertical extension with respect to the first surface smaller than the first vertical extension.

2. The superjunction bipolar transistor of claim 1, wherein:
the reservoir region comprises a central section and a transition section between the central section and the low-resistive region and wherein a mean vertical extension of a portion of the second superjunction structure in the transition section is greater than a vertical extension of a portion of the second superjunction structure in the central section and smaller than the first vertical extension of the first superjunction structure.

3. The superjunction bipolar transistor of claim 1, further comprising:
recombination centers in the semiconductor body, wherein a mean density of the recombination centers in the reservoir region is lower than a mean density of the recombination centers outside of the reservoir region.

4. The superjunction bipolar transistor of claim 1, wherein:
the reservoir region is completely formed in the active transistor cell area.

5. The superjunction bipolar transistor of claim 1, wherein:
at least a portion of the reservoir region is in a vertical projection of a gate conductor structure.

6. The superjunction bipolar transistor of claim 1, wherein:
the reservoir region comprises a set of spatially separated sub-regions.

7. The superjunction bipolar transistor of claim 1, wherein:
the reservoir region comprises a second superjunction structure with a second vertical extension with respect to the first surface smaller than the first vertical extension of the first superjunction structure.

8. The superjunction bipolar transistor of claim 1, further comprising:
a collector structure directly electrically connected to a second load electrode at a reverse side opposite to the front side and forming a continuous layer directly adjoining a second surface of the semiconductor body opposite to the first surface, wherein the collector structure forms a pn junction with a drift structure that comprises the first superjunction structure.

9. The superjunction bipolar transistor of claim 1, wherein:
the superjunction bipolar transistor is or includes an insulated gate bipolar transistor.

10. The superjunction bipolar transistor of claim 1, further comprising:
a reservoir zone in the reservoir region, wherein a mean net dopant concentration of the semiconductor body in the reservoir zone is lower than a mean net dopant concentration in first areas of the first superjunction structure, the first areas alternating with oppositely doped second areas of the first superjunction structure along at least one horizontal direction parallel to the first surface.

11. The superjunction bipolar transistor of claim 10, wherein:
the mean net dopant concentration in the reservoir zone is at most a fifth of the mean net dopant concentration in the first areas of the first superjunction structure.

12. The superjunction bipolar transistor of claim 10, wherein:
the first superjunction structure and the reservoir zone are formed in a drain structure of the semiconductor body between the transistor cells and a collector structure.

13. The superjunction bipolar transistor of claim 1, further comprising:
a collector structure directly electrically connected to a second load electrode at a reverse side opposite to the front side and comprising IGBT zones and oppositely doped diode cathode zones, the IGBT zones and the diode cathode zones directly adjoining a second surface of the semiconductor body opposite to the first surface.

14. The superjunction bipolar transistor of claim 13, wherein:
the diode cathode zones are exclusively in the reservoir region.

15. The superjunction bipolar transistor of claim 13, wherein:
the IGBT zones are exclusively outside of the reservoir region.

16. The superjunction bipolar transistor of claim 13, further comprising:
diode anode zones directly adjoining to the first surface in the reservoir region.

17. The superjunction bipolar transistor of claim 16, wherein:
the active transistor cells are exclusively outside of the reservoir region.

18. The superjunction bipolar transistor of claim 13, further comprising:
counter-doped islands of a conductivity type of the collector structure or the IGBT zones and formed at a distance to the collector structure between the first superjunction structure and the collector structure.

19. The superjunction bipolar transistor of claim 18, wherein:
a mean density of the counter-doped islands in the reservoir region is lower than a mean density of the counter-doped islands outside of the reservoir region.

20. A superjunction semiconductor device, comprising:
a first superjunction structure in a low-resistive region and a reservoir region outside of the low-resistive region, wherein the reservoir region comprises no superjunction structure or a second superjunction structure, wherein, on a condition the reservoir region comprises the second superjunction structure, a first vertical extension of the first superjunction structure with respect to a first surface of the semiconductor body is greater than a mean second vertical extension of the second superjunction structure, and wherein the first superjunction structure comprises first areas and oppositely doped second areas alternating with the first areas along at least one horizontal direction parallel to the first surface;
active transistor cells comprising body zones forming first pn junctions with at least the first areas of the first superjunction structure and second pn junctions with source zones; and
a collector structure electrically connected to a second load electrode wherein at least portions of the collector structure have a conductivity type of the body zones.

21. The semiconductor device of claim 20, further comprising:
a reservoir zone in the reservoir region, wherein a mean net dopant concentration in the reservoir zone is lower than in the first areas of the first superjunction structure.

22. The semiconductor device of claim 20, wherein:
the reservoir region is completely formed in an active transistor cell area that comprises the active transistor cells.

23. The semiconductor device of claim 20, further comprising:
a reservoir zone in the reservoir region, wherein a mean net dopant concentration in the reservoir zone is lower than in the first areas of the first superjunction structure.

24. The semiconductor device of claim 20, wherein:
the reservoir region is completely formed in an active transistor cell area that comprises the active transistor cells.

25. A superjunction semiconductor device, comprising:
a first superjunction structure in a low-resistive region and a reservoir region outside of the low-resistive region, wherein the reservoir region comprises a second superjunction structure, wherein a first vertical extension of the first superjunction structure with respect to a first surface of the semiconductor body is greater than a mean second vertical extension of the second superjunction structure, and wherein the first superjunction structure comprises first areas and oppositely doped second areas alternating with the first areas along at least one horizontal direction parallel to the first surface;

active transistor cells comprising body zones forming first pn junctions with at least the first areas of the first superjunction structure and second pn junctions with source zones; and a collector structure electrically connected to a second load electrode wherein at least portions of the collector structure have a conductivity type of the body zones.

* * * * *